United States Patent
Chang et al.

(10) Patent No.: US 11,397,842 B2
(45) Date of Patent: Jul. 26, 2022

(54) METHOD FOR GENERATING LAYOUT DIAGRAM INCLUDING PROTRUDING PIN CELL REGIONS AND SEMICONDUCTOR DEVICE BASED ON SAME

(71) Applicant: TAIWAN SEMICONDUCTOR MANUFACTURING COMPANY, LTD., Hsinchu (TW)

(72) Inventors: Fong-Yuan Chang, Hsinchu (TW); Chin-Chou Liu, Hsinchu (TW); Sheng-Hsiung Chen, Hsinchu (TW); Po-Hsiang Huang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 11 days.

(21) Appl. No.: 17/131,038

(22) Filed: Dec. 22, 2020

(65) Prior Publication Data

US 2021/0110097 A1 Apr. 15, 2021

Related U.S. Application Data

(62) Division of application No. 16/445,931, filed on Jun. 19, 2019, now Pat. No. 10,878,165.
(Continued)

(51) Int. Cl.
*G06F 7/50* (2006.01)
*G06F 30/398* (2020.01)
(Continued)

(52) U.S. Cl.
CPC .............. *G06F 30/398* (2020.01); *G03F 1/70* (2013.01); *G06F 30/392* (2020.01); *G06F 30/394* (2020.01)

(58) Field of Classification Search
USPC .......................... 716/54, 118, 119, 126, 129
See application file for complete search history.

(56) References Cited

U.S. PATENT DOCUMENTS 7,260,442 B2 8/2007 Hwang et al.
7,469,396 B2 * 12/2008 Hayashi ................ G06F 30/392
716/119
(Continued)

FOREIGN PATENT DOCUMENTS

CN 106558584 B * 7/2019 .......... H01L 27/1104
CN 210628309 U * 5/2020
(Continued)

OTHER PUBLICATIONS

Office Action dated Oct. 30, 2020 for corresponding case No. KR 10-2019-0085915. (pp. 1-6).

*Primary Examiner* — Brian Ngo
(74) *Attorney, Agent, or Firm* — Hauptman Ham, LLP

(57) ABSTRACT

A method (of generating a layout diagram) includes: generating a shell including wiring patterns in a first layer of metallization, the wiring patterns having long axes which are substantially aligned with corresponding tracks that extend in a first direction, the wiring patterns having a default arrangement which has, relative to the corresponding tracks, a first amount of free space; and refining the shell into a cell, the refining including selectively shrinking, in the first direction, one or more of the wiring patterns resulting in a second amount of free space, the second amount being greater than the first amount, increasing, in the first direction, one or more chosen ones of the wiring patterns (chosen patterns), and backfilling the second amount of free space with one or more of at least one dummy pattern or at least one wiring pattern.

20 Claims, 14 Drawing Sheets

Related U.S. Application Data

(60) Provisional application No. 62/698,779, filed on Jul. 16, 2018.

(51) Int. Cl.
  *G03F 1/70* (2012.01)
  *G06F 30/392* (2020.01)
  *G06F 30/394* (2020.01)

(56) References Cited

U.S. PATENT DOCUMENTS

| | | | |
|---|---|---|---|
| 8,103,977 B2* | 1/2012 | Taoka | E21B 43/24 716/54 |
| 8,612,914 B2 | 12/2013 | Sherleker et al. | |
| 9,256,709 B2 | 2/2016 | Yu et al. | |
| 9,384,317 B1 | 7/2016 | Salowe et al. | |
| 2007/0150849 A1 | 6/2007 | Haruki | |
| 2008/0272500 A1* | 11/2008 | Ishio | H01L 23/5225 257/782 |
| 2009/0055792 A1* | 2/2009 | Itagaki | G06F 30/39 716/129 |
| 2010/0293515 A1* | 11/2010 | Inoue | G06F 30/392 716/118 |
| 2011/0272815 A1 | 11/2011 | Misaka et al. | |
| 2013/0090126 A1 | 4/2013 | Xing et al. | |
| 2014/0040838 A1 | 2/2014 | Liu et al. | |
| 2014/0040847 A1 | 2/2014 | Milinichik et al. | |
| 2015/0278429 A1 | 10/2015 | Chang | |
| 2017/0255739 A1 | 9/2017 | Hsieh et al. | |
| 2018/0204762 A1* | 7/2018 | Min | H01L 27/092 |
| 2018/0279145 A1 | 9/2018 | Jung et al. | |
| 2019/0332736 A1 | 10/2019 | Hsieh et al. | |
| 2020/0273863 A1* | 8/2020 | Zhu | G11C 5/063 |

FOREIGN PATENT DOCUMENTS

| | | |
|---|---|---|
| JP | 2007123682 | 5/2007 |
| JP | 2011238746 | 11/2011 |

* cited by examiner

METHOD FOR GENERATING LAYOUT DIAGRAM INCLUDING PROTRUDING PIN CELL REGIONS AND SEMICONDUCTOR DEVICE BASED ON SAME

PRIORITY CLAIM

The instant application is a divisional application of U.S. application Ser. No. 16/445,931, filed Jun. 19, 2019, now U.S. Pat. No. 10,878,165, granted Dec. 29, 2020, which claims priority to Provisional Application No. 62/698,779, filed Jul. 19, 2018, the entire contents of each of which are incorporated by reference herein.

BACKGROUND

An integrated circuit ("IC") includes one or more semiconductor devices. One way in which to represent a semiconductor device is with a plan view diagram referred to as a layout diagram. Layout diagrams are generated in a context of design rules. A set of design rules imposes constraints on the placement of corresponding patterns in a layout diagram, e.g., geographic/spatial restrictions, connectivity restrictions, or the like. Often, a set of design rules includes a subset of design rules pertaining to the spacing and other interactions between patterns in adjacent or abutting cells where the patterns represent conductors in a layer of metallization.

Typically, a set of design rules is specific to a process node by which will be fabricated a semiconductor device based on a layout diagram resulting. The design rule set compensates for variability of the corresponding process node. Such compensation increases the likelihood that an actual semiconductor device resulting from a layout diagram will be an acceptable counterpart to the virtual device on which the layout diagram is based.

BRIEF DESCRIPTION OF THE DRAWINGS

One or more embodiments are illustrated by way of example, and not by limitation, in the figures of the accompanying drawings, wherein elements having the same reference numeral designations represent like elements throughout. The drawings are not to scale, unless otherwise disclosed.

DETAILED DESCRIPTION

Figure 1:
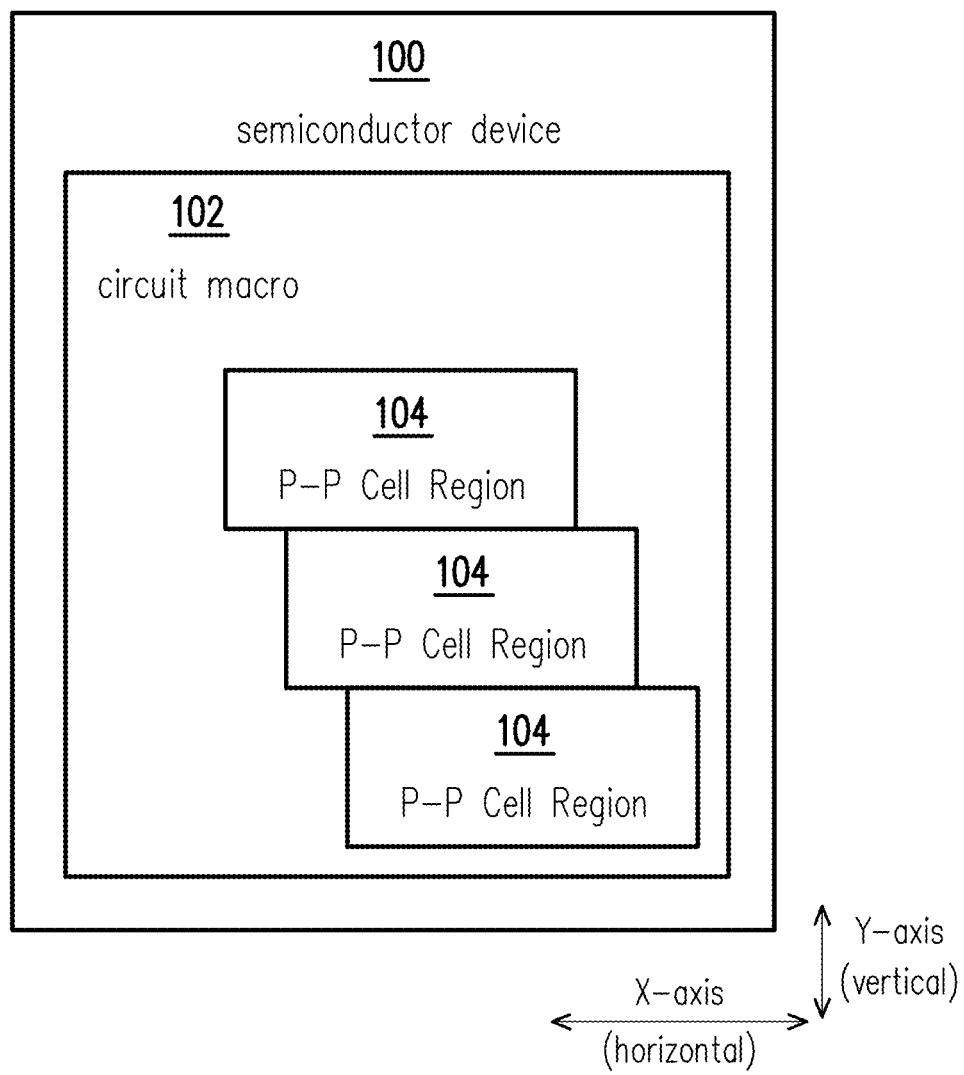
FIG. 1 is a block diagram of a semiconductor device in accordance with at least one embodiment of the present disclosure.

The following disclosure provides many different embodiments, or examples, for implementing different features of the provided subject matter. Specific examples of components, materials, values, steps, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, a method of generating a layout diagram includes generating a shell, which includes wiring patterns in a first layer of metallization, the wiring patterns having long axes which are substantially aligned with corresponding tracks that extend in a first direction, the wiring patterns having a default arrangement which has, relative to the corresponding tracks, a first amount of free space; and refining the shell into a cell, the refining including selectively shrinking, in the first direction, one or more of the wiring patterns resulting in a second amount of free space, the second amount being greater than the first amount, increasing, in the first direction, one or more chosen ones of the wiring patterns (chosen patterns), and backfilling the free space with one or more at least one dummy pattern or at least one wiring pattern.

FIG. 1 is a block diagram of a semiconductor device 100 in accordance with at least one embodiment of the present disclosure.

Semiconductor device 100 includes, among other things, a circuit macro (hereinafter, macro) 102. In some embodiments, macro 102 is an SRAM macro. In some embodiments, macro 102 is a macro other than an SRAM macro. Macro 102 includes, among other things, one or more cell regions 104. Each cell region 104 includes one or more protruding pins (P-Ps) and is referred to as a P-P cell region (P-P cell region) 104. In some embodiments, the one or more protruding pins are referred to as convex-concave pins with cell region 104 accordingly referred to as convex-concave pin region (C-C cell region) 104. Examples of layout diagrams having cells which result in P-P cell region 104 include the layout diagrams disclosed herein.

Figure 2A:
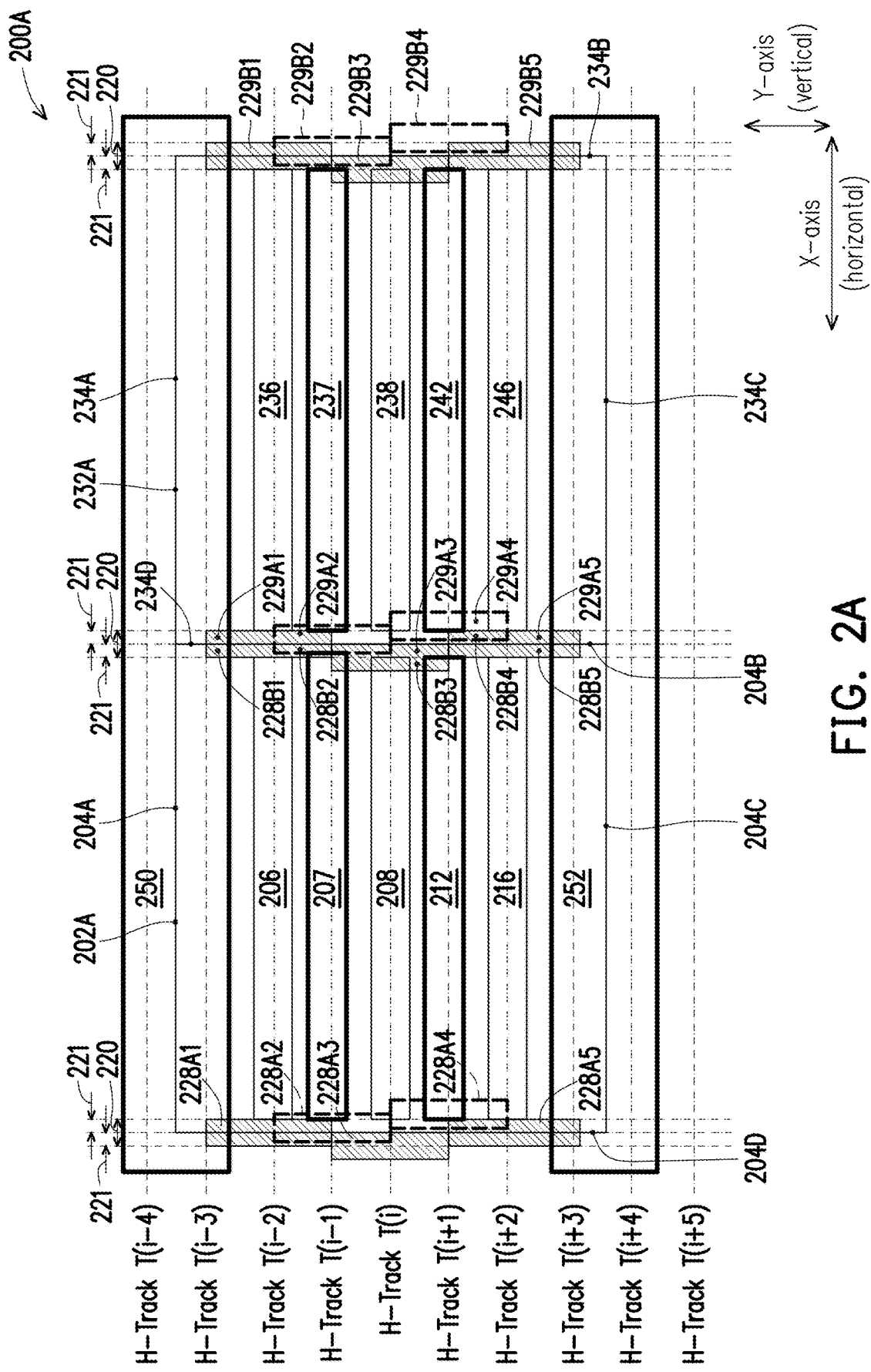
FIG. 2A is a layout diagram of instances of a default cell-template, in accordance with some embodiments.

FIG. 2A is a layout diagram 200A of instances of a default cell-template, in accordance with some embodiments.

Layout diagram 200A is refined progressively as layout diagrams 200B-200F of corresponding FIGS. 2B-2F (discussed below). Correspondingly, cells 202A and 202B are refined progressively as corresponding cells 202B-202F and 232B-232F of corresponding FIGS. 2B-2F (discussed below). In some embodiments, the function of one or both of cells 202F and 232F of FIG. 2F is a corresponding Boolean logic function. In some embodiments, the function of one or both of cells 202F and 232F of FIG. 2F is a corresponding storage function. An example of a semiconductor device having been fabricated based on a larger layout diagram which includes layout diagram 200F of FIG. 2F is semiconductor device 100 of FIG. 1, where one or more of P-P cell regions 104 corresponds to cell 202 and one or more of P-P cell regions 104 corresponds to cell 232. Each of cells 202F and 232F (which represent refinements of corresponding cells 202A and 232A) represents a corresponding function of a semiconductor device having been fabricated based on a larger layout diagram which includes layout diagram 200F of FIG. 2F. In some embodiments, the function is a Boolean logic function. In some embodiments, the function is a storage function.

Layout diagram 200A of FIG. 2A includes instantiations 202A and 232A of (hereinafter, cells 202A and 232A corresponding to) a default cell-template. Recalling that cells 202F and 232F are refinements of corresponding cells 202A and 232A, cells 202F and 232F are unfinished cells which serve as starting points (or shells) for the refinements resulting in corresponding cells 202F and 232F.

Cells 202A and 232A are arranged with respect to an imaginary grid which includes tracks T(i−4), . . . , T(i−1), T(i), T(i+1), . . . , T(i+5), where i is an integer and 0≤i, where each of the tracks extends in a first direction. In some embodiments, the first direction is the horizontal direction. In some embodiments, the first direction is the X-axis.

Cell 202A has a perimeter which includes a side boundary 204A on the top, a side boundary 204B on the right, a side boundary 204C on the bottom and a side boundary 204D on the left. Cell 232A has a perimeter which includes a side boundary 234A on the top, a side boundary 234B on the right, a side boundary 234C on the bottom and a side boundary 234D on the left. Side boundaries 204A and 234A at the corresponding tops and side boundaries 204C and 234C at the corresponding bottoms are substantially parallel to the first direction. Side boundaries 204B and 234B on the corresponding right sides and side boundaries 204D and 234D on the corresponding left sides are substantially parallel to a second direction, where the second direction is substantially perpendicular to the first direction. In some embodiments, where the first direction is the horizontal direction, the second direction is the vertical direction. In some embodiments, where the first direction is the X-axis direction, the second direction is the Y-axis direction. Side boundary 204B of cell 202A is substantially collinear with side boundary 234D of cell 232A. As such, cell 202A abuts cell 232A in the horizontal direction.

Cell 202A includes wiring patterns 206, 207, 208, 212 and 216 which are rectangular. Long axes of symmetry of wiring patterns 206, 207, 208, 212 and 216 are substantially aligned with corresponding H-tracks T(i−2), T(i−1), T(i), T(i+1) and T(+2). Cell 232A of the default cell template includes wiring patterns 236, 237, 238, 242 and 246 which are rectangular. Long axes of symmetry of wiring patterns 236, 237, 238, 242 and 246 are substantially aligned with corresponding H-tracks T(i−2), T(i−1), T(i), T(i+1) and T(+2).

It is assumed that the process node by which is fabricated a semiconductor device based on a larger layout diagram which includes layout diagram 200F of FIG. 2F (where layout diagram 200F is a refinement of layout diagram 200A) uses double-patterning lithography. Accordingly, wiring patterns 206, 208, 216, 236, 238 and 246 are shown in the color red, whereas wiring patterns 207, 212, 237 and 242 are shown in the color green.

To the extent that some or all of each of wiring patterns 206, 207, 208, 212, 216, 236, 237, 238, 242 and/or 246 (hereinafter, remaining wiring patterns) are still present in layout diagram 200F, the remaining wiring patterns correspond to conductors included in a first layer of metallization, M_1st, in a semiconductor device having been fabricated based on a larger layout diagram which includes layout diagram 200F of FIG. 2F. In some embodiments, depending upon the numbering convention of the corresponding process node by which such a semiconductor device is fabricated, the first (1st) layer of metallization M_1st is either metallization layer zero, M0, or metallization layer one, M1. In FIGS. 2A-2F, M_1st is assumed to be M0. In some embodiments, M0 is the first layer of metallization above a transistor layer (see FIG. 3A, discussed below) in which transistors are formed.

In some embodiments, cells 202A and 232A include corresponding transistor layers (not shown). In some embodiments, the transistor layer of each of cells 202A and 232A includes corresponding sub-layers (not shown). The sub-layers include component patterns (not shown) corresponding to components, e.g., transistors, of a circuit that would result from a larger layout diagram which includes layout diagram 200F (where layout diagram 200F is a refinement of layout diagram 200A as well as layout diagrams 200B-200E (discussed below)).

In some embodiments, the transistor layer of each of cells 202A and/or 232A is designated for CMOS configuration such that a semiconductor device having been fabricated based on a layout diagram (which includes cell 202A and/or 232A) would be a CMOS device. An example of a CMOS semiconductor device having been fabricated based on layout diagram 200F (where layout diagram 200F is a refinement of layout diagram 200A) is semiconductor device 100 of FIG. 1, wherein P-P cell region 104A of semiconductor device 100 results from cell 202A or cell 232A. Where designated for CMOS configuration, cell 202A is organized into a first area (not shown) designated for PMOS-configuration and a second area (not shown) designated for NMOS-configuration. Details regarding CMOS configuration and corresponding fabrication are found, e.g., in U.S. Pat. No. 8,786,019, granted Jul. 22, 2014, the entirety of each of which is hereby incorporated by reference. In some embodiments, the transistor layer of each of cells 202A and/or 232A is designated for PMOS configuration and not for CMOS configuration. In some embodiments, the transistor layer of each of cells 202A and/or 232A is designated for NMOS configuration and not for CMOS configuration.

The default cell-template instantiated by each of cells 202A and 232A assumes that each of wiring patterns 206, 207, 208, 212, 216, 236, 237, 238, 242 and 246: does not extend beyond the perimeters of corresponding cells 202A and 232A; and has a maximum length in the horizontal direction. A default first design rule for the process node associated with the default cell-template imposes a minimum gap (end-to-end gap) 220 between ends of substantially co-track aligned wiring patterns. In some embodiments, a corresponding second default design rule imposes a minimum boundary offset 221 between an end of a wiring pattern and a side boundary of a cell. In some embodiments, minimum boundary offset 221 is substantially half of end-to-end gap 220.

In view of minimum boundary offset 221, cell 202A includes rectangular cut patterns 228A1-228A5 and 228B1-228B5, and cell 232A includes cut patterns 229A1-229A5 and 229B1-229B5. In general, where a subject pattern underlies a given cut pattern such that a portion of the subject pattern is overlapped by the given cut pattern, the given cut pattern is used to indicate that the overlapped portion of the subject pattern eventually will be removed during fabrication of a corresponding semiconductor device. Cut patterns 228A1, 228A3, 228A5, 228B1, 228B3, 228B5, 229A1, 229A3, 229A5, 229B1, 229B3 and 229B5 are shown in the color brown to indicate cut-significance with respect to corresponding red-colored wiring patterns 206, 208, 216, 236, 238 and 246. Cut patterns 228A2, 228A4, 228B2, 228B4, 229A2, 229A4, 229B2 229B4 are shown in the color blue to indicate cut-significance with respect to corresponding green-colored wiring patterns 207, 212, 237 and 242.

Cut patterns 228A1-228A5, 228B1-228B5, 229A1-229A5 and 229B1-229B5 are rectangular. For purposes of illustration, long axes of symmetry of cut patterns 228A1-228A5 are roughly, though not substantially aligned with side boundary 204D of cell 202A, and long axes of symmetry of cut patterns 228B1-228B5 are roughly, though not substantially aligned with side boundary 204B of cell 202A. Such rough alignment makes it easier to discern each of cut patterns 228A1-228A5 and 228B1-228B5 in FIG. 2A.

In practice, long axes of symmetry of cut patterns 228A1-228A5 and 228B1-228B5 would be substantially aligned with corresponding side boundaries 204D and 204B of cell 202A. Similarly, for purposes of illustration, long axes of symmetry of cut patterns 229A1-229A5 and 229B1-229B5 are roughly, though not substantially aligned with corresponding side boundaries 234D and 234B of cell 232A. In practice, long axes of symmetry of cut patterns 229A1-229A5 and 229B1-229B5 would be substantially aligned with corresponding side boundaries 234D and 234B of cell 232A. In some embodiments, cut patterns 228B1-228B5 are aligned over corresponding cut patterns 229A1-229A5. In some embodiments, cut patterns 229A1-229A5 are aligned over corresponding cut patterns 228B1-229B5. In some embodiments, cut patterns 228B1-228B5 are merged with corresponding cut patterns 229A1-229A5.

In FIG. 2A, wiring patterns which comprise M0 further include power grid (PG) patterns 250 and 252 which are rectangular and represent portions of longer corresponding power grid lines of a semiconductor device which has been fabricated based on layout diagram 200F (where layout diagram 200F is a refinement of layout diagram 200A). Accordingly, PG patterns 250 and 252 are shown as extending outside of cells 202A and 232A in the horizontal direction. which are rectangular. Long axes of symmetry of PG patterns 250 and 252 are substantially parallel to the horizontal direction. In some embodiments, PG pattern 250 is designated for a first reference voltage and PG pattern 252 is designated for a second reference voltage. In some embodiments, the first reference voltage is VDD and the second reference voltage is VSS.

Under the assumption of double-patterning lithography, PG patterns 250 and 252 are shown in the color green-colored. Cut patterns 228A1, 228B1, 229A1, 229B1, 228A5, 228B5, 229A5 and 229B5 overlie corresponding PG patterns 250 and 252 but only have cut-significance with respect to corresponding wiring patterns 206, 216, 236 and 246. PG patterns 250 and 252 are not effected by cut patterns 228A1, 228B1, 229A1, 229B1, 228A5, 228B5, 229A5 and 229B5.

Figure 2B:
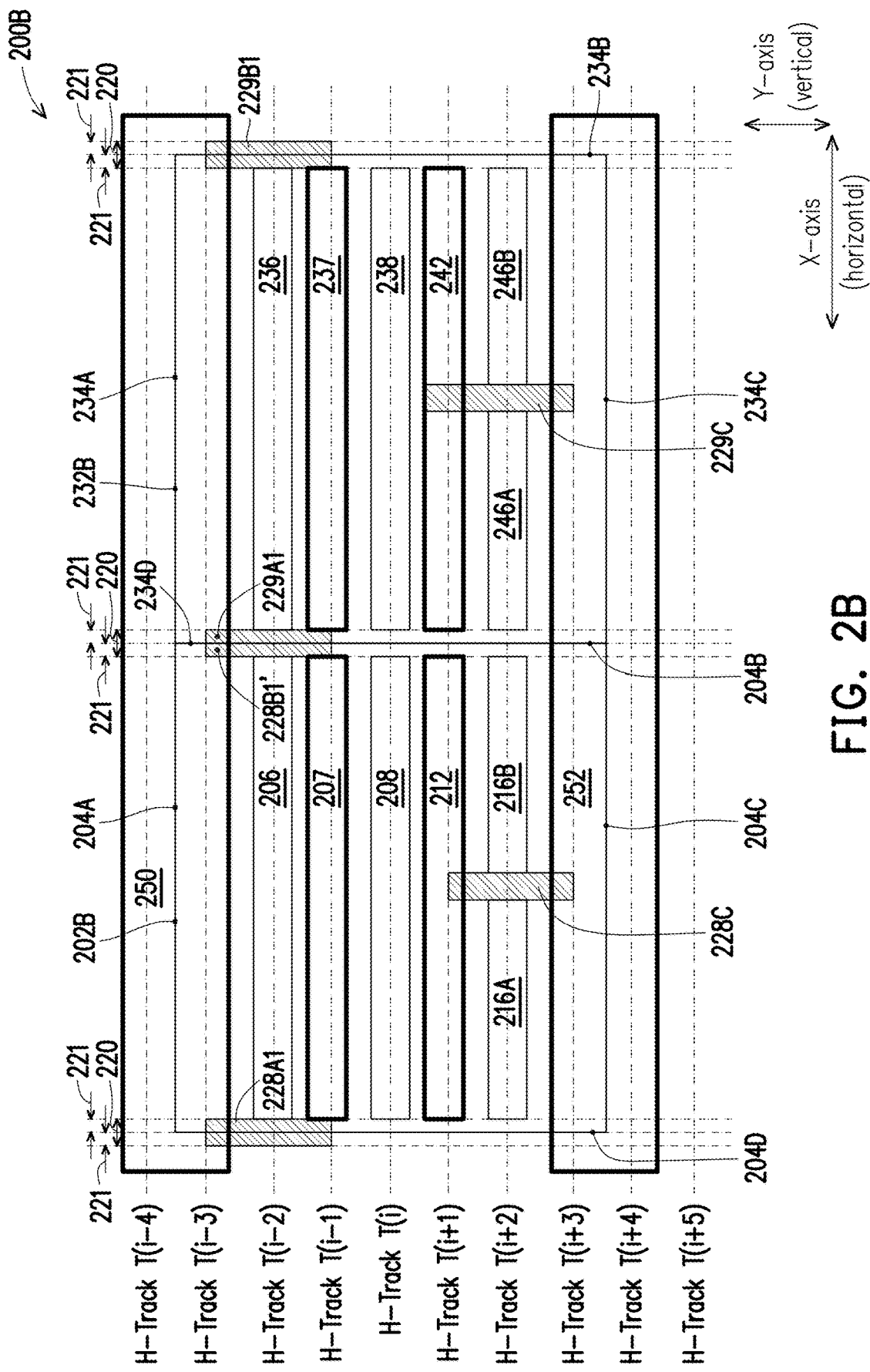
FIG. 2B is a layout diagram of a refinement of the layout diagram of FIG. 2A, in accordance with some embodiments.

FIG. 2B is a layout diagram 200B of a refinement of layout diagram 200A (FIG. 2A), in accordance with some embodiments.

Layout diagram 200B of FIG. 2B is similar to layout diagram 200A of FIG. 2A. For brevity, the discussion of layout diagram 200B will focus on differences of layout diagram 200B with respect to layout diagram 200A.

Layout diagram 200B represents a refinement of layout diagram 200A in multiple respects. In at least a first respect, e.g., layout diagram 200B represents a refinement of layout diagram 200A, e.g., in terms of identifying which of cut patterns 228A1-228A5, 228B1-228B5, 229A1-229A5, 229A1-229A5 and 229B1-229B5 should retained in order to achieve (at least in part) the functions which corresponding cells 202F and 232F represent (where, again, cells 202F and 232F are corresponding refinements of cells 202B and 232B).

As an example, in FIG. 2B, in order to achieve (at least in part) the functions which corresponding cells 202F and 232F represent, it is assumed that each of wiring patterns 206 and 236 should be an intra-cell wiring pattern. In some embodiments, intra-cell wiring patterns 206 and 236 represent conductors in corresponding cell regions of a semiconductor device which has been fabricated based on a larger layout diagram which includes layout diagram 200F of FIG. 2F. In some embodiments, an intra-cell wiring pattern represents an intra-cell conductor in corresponding cell regions in a semiconductor device having been fabricated based on a larger layout diagram which includes layout diagram 200F of FIG. 2F, wherein an intra-cell conductor carries a signal which is internal to the function of the corresponding cell region. An intra-cell conductor is different than a pin. A pin is a type of conductor which carries an input/output (I/O) signal of the function of the corresponding cell region.

More particularly as to the example of FIG. 2B, in order to achieve (at least in part) the functions which corresponding cells 202F and 232F represent (where, again, cells 202F and 232F are corresponding refinements of cells 202B and 232B), it is further assumed that each of intra-cell wiring patterns 206 and 236 should have a maximum length in the horizontal direction in order to achieve (at least in part) the functions which corresponding cells 202F and 232F represent. In some embodiments, absent some reason to the contrary, for example, a routing conflict, intra-cell wiring patterns (e.g., as patterns 206 and 236) default to a maximum length in the horizontal direction so that a semiconductor device which has been fabricated based on the corresponding layout diagram (e.g., layout diagram 200A) exhibits correspondingly increased structural density. Such a semiconductor device can be planarized more quickly, e.g., because the increased structural density reduces irregularities in surface topography. In some embodiments, the maximum length ($L_{MAX}$) is substantially equal to the difference between a width of the cell ($L_W$) and twice the minimum boundary offset ($L_{OFF}$) such that $L_{MAX} \approx L_W - 2*L_{OFF}$. Accordingly, at this point in the refinement, it is clear that cut patterns 228A1 and 228B1 should overlie corresponding ends of intra-cell wiring pattern 206, and cut patterns 229A1 and 229B1 should overlie corresponding ends of intra-cell wiring pattern 236. Cut patterns 228A1, 228B1', 229A1 and 229B1 are shown in brown to indicate cut-significance with respect to corresponding red-colored wiring patterns 206 and 236. Cut patterns 228A1, 228B1, 229A1 and 229B1 overlie corresponding PG patterns 250 and 252 and green-colored wiring patterns 207 and 237 but only have cut-significance with respect to red-colored wiring patterns 206 and 236. PG patterns 250 and 252 and green-colored wiring patterns 207 and 237 are not effected by corresponding cut patterns 228A1, 228B1, 229A1 and 229B1.

In at least a second respect, e.g., layout diagram 200B represents a refinement of layout diagram 200A, e.g., in terms of identifying additional cut patterns needed in order to achieve (at least in part) the functions which corresponding cells 202F and 232F represent (where, again, cells 202F and 232F are corresponding refinements of cells 202B and 232B). More particularly, in order to achieve (at least in part) the functions which corresponding cells 202F and 232F represent, as an example, it is assumed that each of wiring patterns 216 and 246 should be split substantially in half into corresponding wiring patterns 216A, 216B, 246A and 246B in order to achieve (at least in part) the functions which corresponding cells 202F and 232F represent. In some embodiments, wiring patterns 216 and 246 are divided into corresponding portions other than halves. Accordingly, at this point in the refinement, it is clear that cut patterns 228C and 229C should be added to corresponding cells 202B and 232B.

Cut patterns 228C and 229C are shown in brown to indicate cut-significance with respect to corresponding red-colored wiring patterns 216 and 246. Cut patterns 228C and 229C overlie PG pattern 252 and green-colored wiring patterns 212 and 242 but only have cut-significance with respect to red-colored wiring patterns, e.g., 216 and 246. PG pattern 252 and green-colored wiring patterns 212 and 242 are not effected by corresponding cut patterns 228C and 229C.

In at least a third respect, e.g., layout diagram 200B represents a refinement of layout diagram 200A, e.g., in terms of removing portions of cut patterns 228A2-228A5, 228B2-228B5, 229A2-229A5 and 229B2-229B5 of FIG. 2A which may not be needed in order to achieve (at least in part) the functions which corresponding cells 202F and 232F represent (where, again, cells 202F and 232F are corresponding refinements of cells 202B and 232B). At this point in the refinement, it is not clear how much, if any, of wiring patterns 207, 208, 212, 237, 238 and 242 should retained. Accordingly, at this point in the refinement, cut patterns 228A2-228A5 and 228B2-228B5 which overlie ends of corresponding wiring patterns 207, 208 and 212 have been removed, and portions of patterns 229A2-229A5 and 229B2-229B5 which overlie ends of corresponding wiring patterns 237, 238 and 242 have been removed.

Figure 2C:
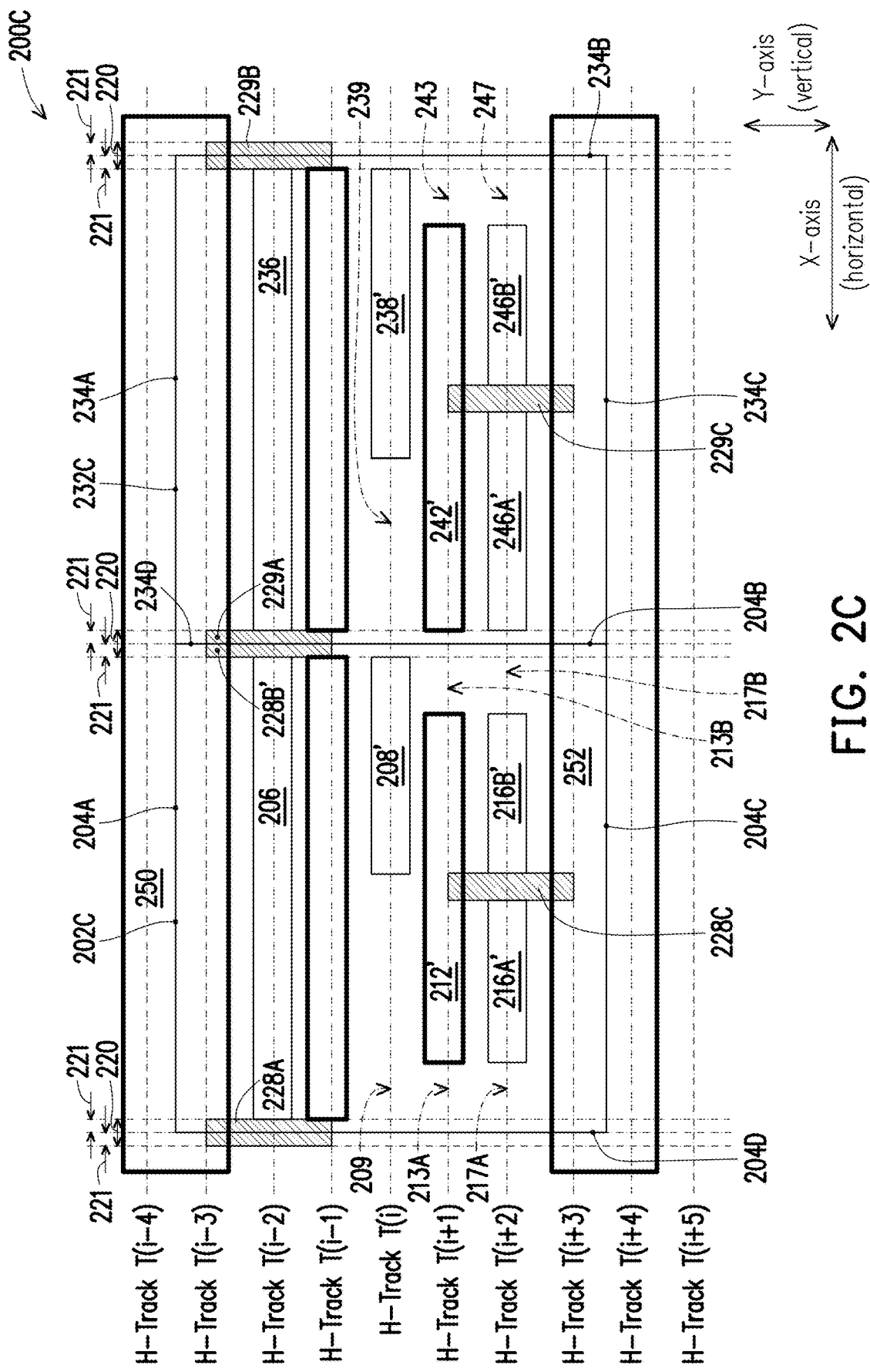
FIG. 2C is a layout diagram of a refinement of the layout diagram of FIG. 2B, in accordance with some embodiments.

FIG. 2C is a layout diagram 200C of a refinement of layout diagram 200B (FIG. 2B), in accordance with some embodiments.

Layout diagram 200C of FIG. 2C is similar to layout diagram 200B of FIG. 2B. For brevity, the discussion of layout diagram 200C will focus on differences of layout diagram 200C with respect to layout diagram 200B.

Layout diagram 200C represents a refinement of layout diagram 200B in multiple respects. In at least a first respect, e.g., layout diagram 200C represents a refinement of layout diagram 200B, e.g., in terms of having determined which of wiring patterns 207, 208, 212, 236, 238 and 242 of corresponding cells 202B and 232B may possibly be removed without impairing an ability to achieve (at least in part) the functions which corresponding cells 202F and 232F represent (where cells 202F and 232F are corresponding refinements of cells 202C and 232C). Continuing the example of FIG. 2B into FIG. 2C, it is determined that wiring patterns 207 and 237 are not necessary in order to achieve (at least in part) the functions which corresponding cells 202F and 232F represent. Accordingly, layout diagram 200C shows no wiring patterns aligned with track T(i–1) in reflection of wiring patterns 207 and 237 having been removed.

Regarding FIG. 2C, in at least a second respect, e.g., layout diagram 200C represents a refinement of layout diagram 200B, e.g., in terms of having determined which portions of corresponding wiring patterns 208, 212, 216A, 216B, 238, 242, 246A and 246B may be removed without impairing an ability to achieve (at least in part) the functions which corresponding cells 202F and 232F represent (where cells 202F and 232F are corresponding refinements of cells 202C and 232C). Further continuing the example of FIG. 2B into FIG. 2C, it is determined that portions of corresponding wiring patterns 208, 212, 216A, 216B, 238, 242, 246A and 246B may be removed without impairing an ability to achieve (at least in part) the functions which corresponding cells 202F and 232F represent, resulting in shortened (in the horizontal direction) corresponding wiring patterns 208', 212', 216A', 216B', 238', 242', 246A' and 246B' and corresponding gaps 209, 213A, 213B, 217A, 217B, 239, 243 and 247. At this point in the refinement, it is not clear whether any of wiring patterns 208', 212', 216A', 216B', 238', 242', 246A' and 246B' subsequently will be extended in the horizontal direction. Accordingly, and with the exceptions of the ends of wiring patterns resulting from corresponding cut patterns 228C and 229C (discussed above), cut patterns or dummy patterns (the latter discussed below) are not shown at corresponding ends of wiring patterns 208', 212', 216A', 216B', 238', 242', 246A' and 246B'.

Figure 2D:
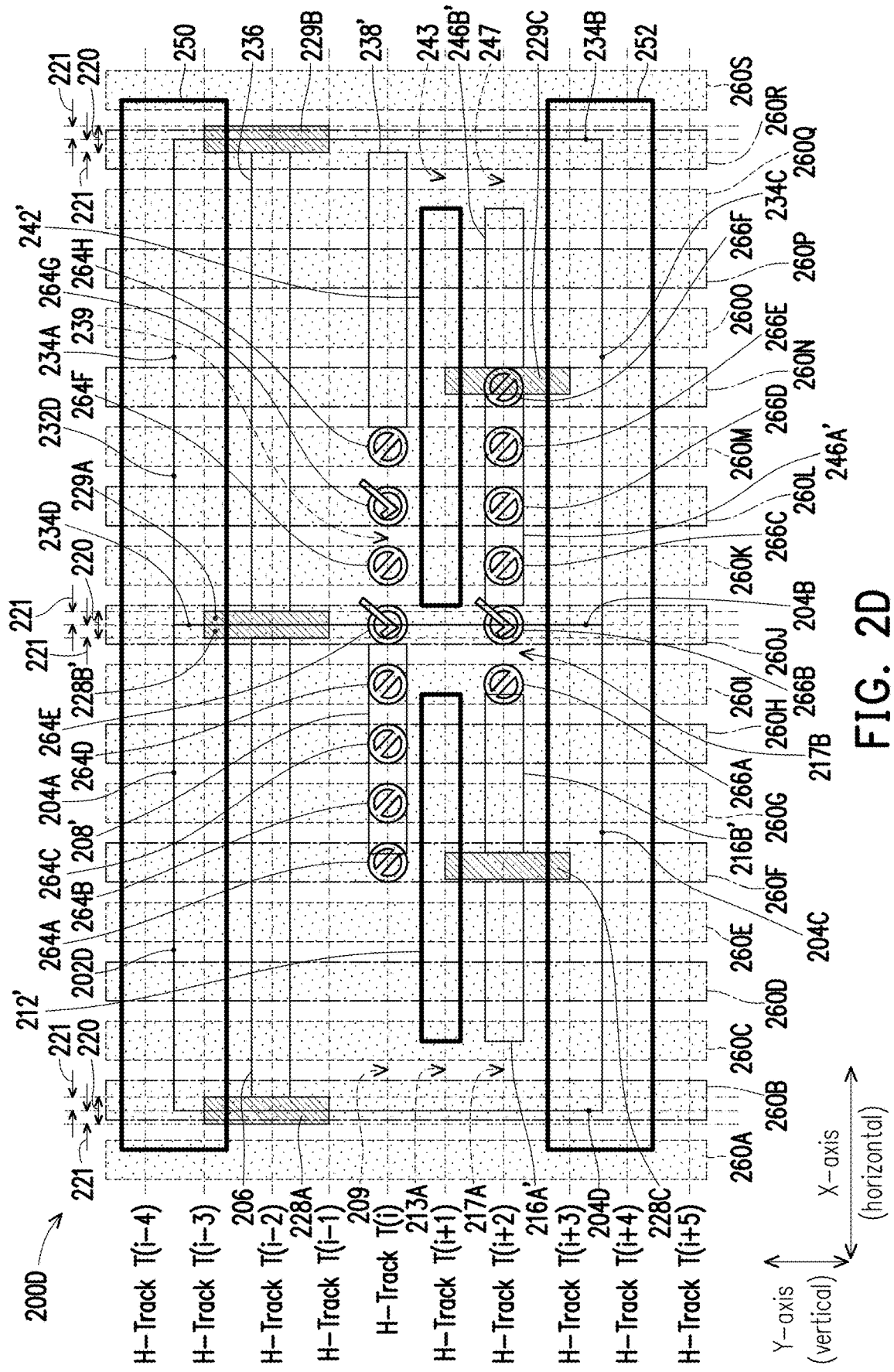
FIG. 2D is a layout diagram of a refinement of the layout diagram of FIG. 2C, in accordance with some embodiments.

FIG. 2D is a layout diagram 200D of a refinement of layout diagram 200C (FIG. 2C), in accordance with some embodiments.

Layout diagram 200D of FIG. 2D is similar to layout diagram 200C of FIG. 2C. For brevity, the discussion of layout diagram 200D will focus on differences of layout diagram 200D with respect to layout diagram 200C.

Layout diagram 200D represents a refinement of layout diagram 200C in at least a first respect, e.g., in terms of having determined which of wiring patterns 208', 212', 216A', 216B', 238', 242', 246A' and 246B' are to be selectively extended across a corresponding cell side boundary in order to achieve (at least in part) the functions which corresponding cells 202F and 232F represent (where cells 202F and 232F are corresponding refinements of cells 202D and 232D). Continuing the example of FIG. 2C into FIG. 2D, it is determined: that wiring pattern 208' can be extended to cross side boundary 204B, resulting in wiring pattern 208" (see FIG. 2E) which projects outside the perimeter of cell 202D into cell 232D; and that wiring pattern 246A' can be extended so as to cross side boundary 234D, resulting in wiring pattern 246A" (see FIG. 2E) which projects outside the perimeter of cell 232D into cell 202D. In some embodiments, a placement and routing (P & R) tool, e.g., software, is used to determine that wiring patterns can be extended to cross boundaries, e.g., that wiring pattern 208' can be extended to cross side boundary 204B and wiring pattern 246A' can be extended so as to cross side boundary 234D.

More particularly, further continuing the example of FIG. 2C into FIG. 2D, each of wiring patterns 208' and 246A' is a pin pattern which represents a pin in a corresponding cell region a semiconductor device having been fabricated based on a larger layout diagram which includes layout diagram 200F of FIG. 2F, wherein a pin (again) is a type of conductor which carries an input/output (I/O) signal of the function of the corresponding cell region. A pin is different than an intra-cell conductor, as explained above. In some embodiments, wiring pattern 208' and/or wiring pattern 246A' is a trans-boundary intra-cell wiring pattern which extends across a side boundary of a cell.

In some embodiments, the determination to extend wiring pattern 208' (hereinafter pin pattern 208') into 232D takes into consideration which conductor patterns in an immediately overlying layer of metallization are available for connection to pin pattern 208'. Further continuing the example of FIG. 2C into FIG. 2D, recalling that pin pattern 208' is included in layer M0 of metallization, the immediately overlying layer is layer M1 of metallization. Accordingly, FIG. 2D shows wiring patterns 260A-260S as being included in layer M1. Wiring patterns 260A-260S are rectangular. Long axes of symmetry of wiring patterns 260A-260S are substantially aligned with corresponding V-tracks (not shown), where the V-tracks extend in the vertical direction. It is assumed that the process node by which is fabricated a semiconductor device based on a larger layout diagram which includes layout diagram 200F of FIG. 2F (where layout diagram 200F is a refinement of layout diagram 200A) uses double-patterning lithography. Accordingly, wiring patterns 260A, 260C, 260E, 260G, 260I, 260K, 260M, 260O, 260Q and 260S are shown in the color pink, whereas wiring patterns 260B, 260D, 260F, 260H, 260J, 260L, 260N, 260P and 260R are shown in the color aqua.

In FIG. 2C, it was determined that a portion of pin pattern 208' extending from side boundary 204D towards side boundary 204B, and ending partially underneath wiring 260F should be removed. Accordingly, in FIG. 2D, it is determined if, and to what extent, pin pattern 208' could be extended in the horizontal direction towards and beyond side boundary 204B of cell 202D. In FIG. 2D, it is assumed that wiring patterns 260F-260L overlap pin pattern 208', as well as gap 239 in the horizontal direction between pin pattern 208' of cell 202D and wiring pattern 238' of cell 232D. If one or more of wiring patterns 260F-260L is available, a connection to pin pattern 208' could be made, and if so then would be indicated with a via pattern (not shown). Such a via pattern would represent a via (an electrically conductive structure) in an interconnect layer (not shown) between layers M0 and M1.

Further continuing the example of FIG. 2C into FIG. 2D, relative to the horizontal direction, pin pattern 208' is only partially overlapped by wiring pattern 260F. In some embodiments, full overlap (relative to the horizontal direction) by a given wiring pattern in the M1 layer (hereinafter, the given M1 pattern) over a corresponding given wiring pattern in the M0 layer (hereinafter, the given M0 pattern), plus extension (relative to the horizontal direction) of the given M0 pattern a predetermined distance beyond each of first and second sides of the given M1 pattern, is regarded as a sufficient amount of overlap for purposes of making a via-based connection between the given M0 pattern and the corresponding given M1 pattern. Accordingly, here, it is determined that the overlap of pin pattern 208' by wiring pattern 260F is insufficient for interposing a via pattern therebetween, as indicated by a corresponding circle-backslash symbol 264A. Because of the first design rule which provides minimum end-to-end gap 220, it is also recognized that wiring pattern 208' could not be extended sufficiently far into cell 232D so as to provide a sufficient underlap of wiring pattern 260M, purposes of making a via-based connection therebetween, as indicated by a corresponding circle-backslash symbol 264H. It is also assumed that each of wiring patterns 260G, 260H, 260I and 260J has a routing conflict and so is not available for connection to pin pattern 208', as indicated by corresponding circle-backslash symbols 264B, 264C, 264D and 264F.

Yet further continuing the example of FIG. 2C into FIG. 2D, it is yet further assumed that neither of wiring patterns 260J nor 260L has a routing conflict and so each is available for connection to pin pattern 208', as indicated by corresponding check marks 264E and 264G. Connecting pin pattern 208' to wiring pattern 260L would necessitate extending pin pattern 208' further into cell 232D than if pin pattern 208' were to be connected to wiring pattern 260J. In general, shorter wiring pattern lengths are better in terms length-cumulative resistance, signal propagation delay, or the like. Accordingly, in layout diagram 200D, it is assumed that pin pattern 208' is extended to connect to wiring pattern 260J. In some embodiments, pin pattern 208' is extended to connect to wiring pattern 260L.

Similarly, in FIG. 2D, regarding pin pattern 246A', relative to the horizontal direction, and yet further continuing the example of FIG. 2C into FIG. 2D, it is also assumed that wiring patterns 260I-260N overlap pin pattern 246A', as well as gap 217B in the horizontal direction between pin pattern 246A' of cell 232D and wiring pattern 216B' of cell 202D. Because of the first design rule which provides minimum end-to-end gap 220, it is recognized that wiring pattern 246A' could not be extended sufficiently far into cell 202D so as to provide a sufficient underlap of wiring pattern 260I for purposes of making a via-based connection therebetween, as indicated by a corresponding circle-backslash symbol 266A. Similarly, it is also recognized that wiring pattern 246A' could not be extended sufficiently far towards side boundary 234B of cell 232D so as to provide a sufficient underlap of wiring pattern 260N for purposes of making a via-based connection therebetween, as indicated by a corresponding circle-backslash symbol 266F. Yet further continuing the example of FIG. 2C into FIG. 2D, it is also assumed that each of wiring patterns 260K, 260L and 260M has a routing conflict and so is not available for connection to pin pattern 246A', as indicated by corresponding circle-backslash symbols 266C, 266D and 266E. It is yet further assumed that wiring pattern 260J does not have a routing conflict and so is available for connection to pin pattern 246A', as indicated by a corresponding check mark 266B.

For simplicity of illustration, it has been assumed that wiring pattern 260J does not have a routing conflict with respect to making a via-based connection to each of pin pattern 208' and pin pattern 246A'. In some embodiments, the functions which corresponding cells 202F and 232F represent (where, again, cells 202F and 232F are corresponding refinements of cells 202B and 232B) can be achieved (at least in part) by electrically connecting pin pattern 208' to pin pattern 246A' using corresponding via-based connections to wiring pattern 260J (see FIG. 2F, discussed below). In some embodiments, in order to achieve (at least in part) the functions which corresponding cells 202F and 232F represent, pin pattern 208' should not be connected electrically to pin pattern 246A' through wiring pattern 260J as well as corresponding via-based connections therebetween; accordingly, in such embodiments, a cut pattern (not shown) which is specific to pink-colored wiring patterns 260A, 260C, 260E, 260G, 260I, 260K, 260M, 260O, 260Q and 260S, is located over the intersection of aqua-colored wiring pattern 260J and track T(i+2). In some embodiments, wiring pattern 260J will have a routing conflict with respect to making a via-based connection to pin pattern 208' but not with respect to pin pattern 246A' whereas one or more of wiring patterns 260G, 260H, 260I and 260J will not have a routing conflict with respect to making a via-based connection to pin pattern 208'. In some embodiments, wiring pattern 260J will have a routing conflict with respect to making a via-based connection to pin pattern 246A' but not with respect to pin pattern 208' whereas one or more of wiring patterns 260K, 260L and 260M will not have a routing conflict with respect to making a via-based connection to pin pattern 246A'.

Figure 2E:
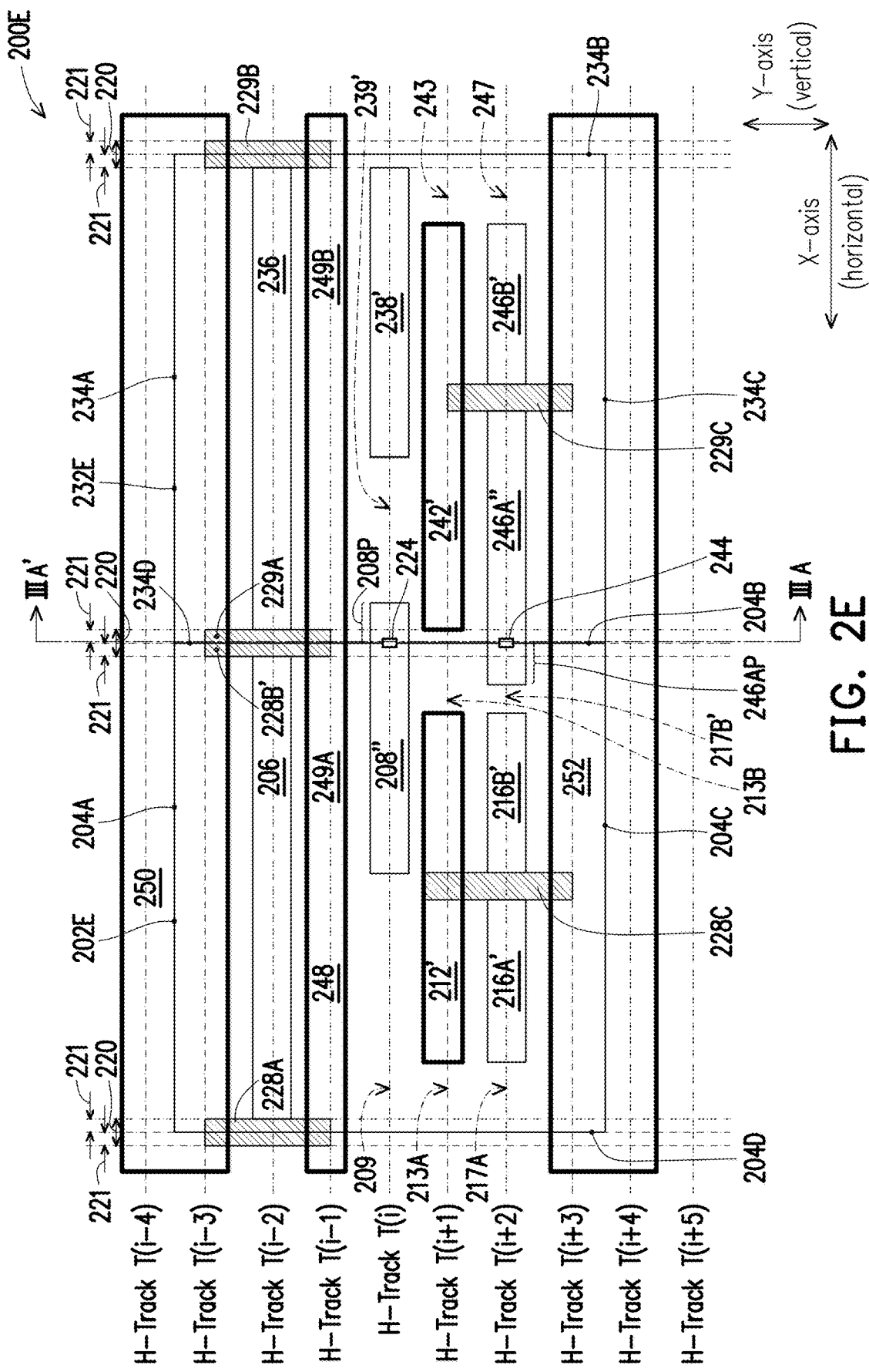
FIG. 2E is a layout diagram 200E of a refinement of the layout diagram of FIG. 2D, in accordance with some embodiments.
Figure 2F:
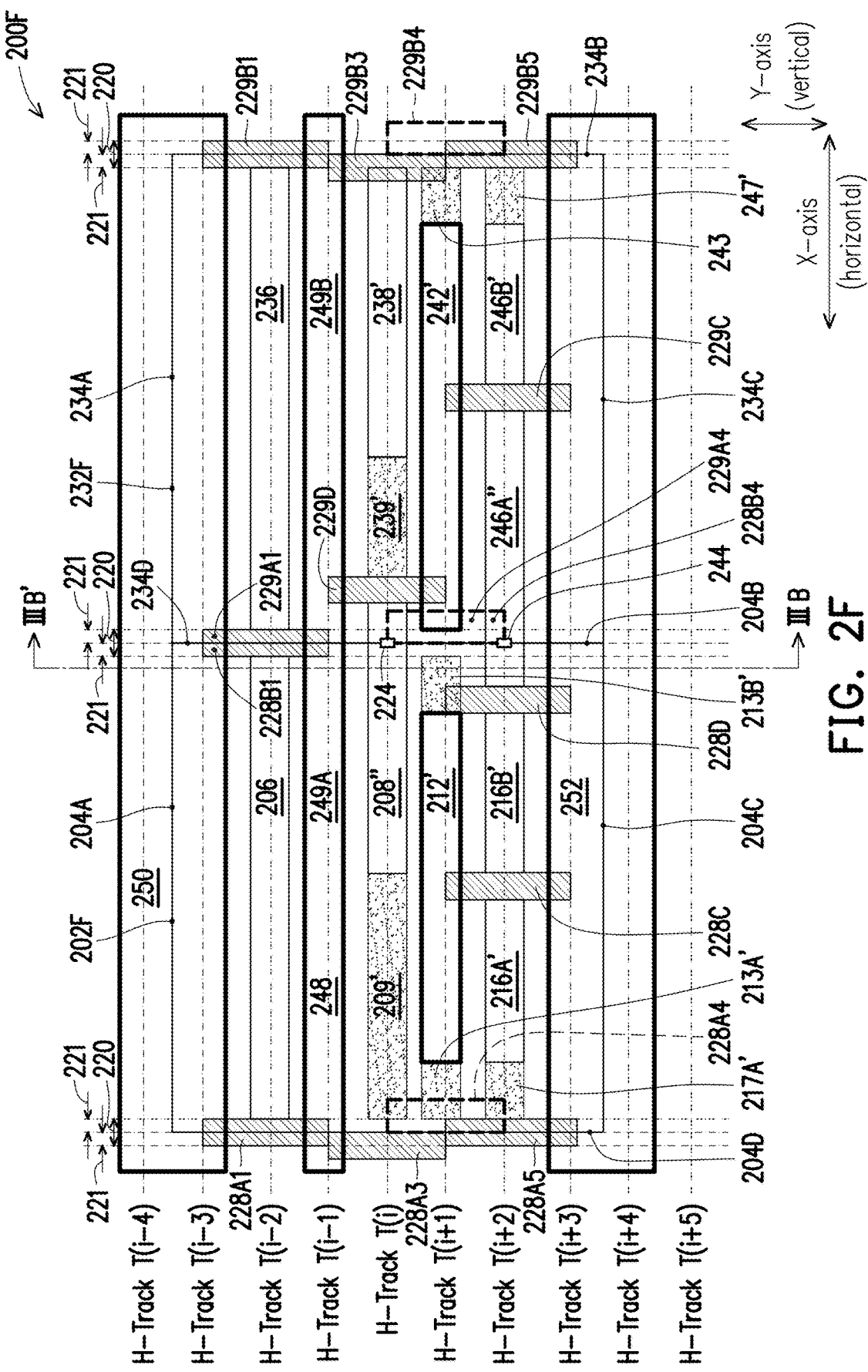
FIG. 2F is a layout diagram 200F of a refinement of the layout diagram of FIG. 2E, in accordance with some embodiments.

FIG. 2E is a layout diagram 200E showing a refinement of layout diagram 200D (FIG. 2D), in accordance with some embodiments.

Layout diagram 200E of FIG. 2E is similar to layout diagram 200D of FIG. 2D. For brevity, the discussion of layout diagram 200E will focus on differences of layout diagram 200E with respect to layout diagram 200D.

Layout diagram 200E represents a refinement of layout diagram 200D in multiple respects. Layout diagram 200E represents a refinement of layout diagram 200D in at least a first respect, e.g., in terms of showing the results of the determination described above in the context of layout diagram 200D of FIG. 2D. Continuing the example of FIG. 2D into FIG. 2E, pin pattern 208' of FIG. 2D has be extended to cross side boundary 234D of cell 232E, resulting in wiring pattern 208"; and pin pattern 246A' of FIG. 2D has been extended to cross side boundary 204B of cell 202E. A portion 208P of pin pattern 208" extends into cell 232E such that pin pattern 208" can be described as a protruding pin (p-pin) pattern 208" and cell 202E can be further described as protruding pin (P-P) cell 202E. A portion 246AP of pin pattern 246A" extends into cell 202E such that pin pattern 246A" can be described as a protruding pin (p-pin) pattern 246A" and cell 232E can be further described as P-P cell 232E. A semiconductor device fabricated based on a larger layout diagram which includes layout diagram such as layout diagram 200F of FIG. 2F would include first and second P-P cell regions 104 corresponding to P-P cell 202E and P-P cell 232E. P-pin pattern 208" projects outside the perimeter of cell 202E into cell 232E, resulting in a smaller gap 239' between p-pin pattern 208" and wiring pattern 238'. P-pin pattern 246A" projects outside the perimeter of cell 232E into cell 202E, resulting in a smaller gap 217B' between wiring pattern 216B' and p-pin pattern 246A".

Layout diagram 200E represents a refinement of layout diagram 200D in at least a second respect, e.g., in terms of showing via patterns 224 and 244 which indicate electrical connections between wiring pattern 260J of layer M1 (not shown in FIG. 2E but see FIG. 2D) and corresponding p-pin patterns 208" and 246A" of layer M0. Via patterns 224 and 244 would represent a via (a conductive structure) in an interconnect layer (not shown) between layers M0 and M1. A semiconductor device fabricated based on a larger layout diagram which includes layout diagram such as layout diagram 200E of FIG. 2E would include first and second vias corresponding to via patterns 224 and 244.

In at least a third respect, layout diagram 200E represents a refinement of layout diagram 200D, e.g., in terms of having added a wiring pattern 248 which is rectangular and is referred to as a feedthrough pattern. A long axis of feedthrough pattern 248 is substantially aligned with H-track T(i−1). Feedthrough pattern 248 corresponds to a feedthrough conductor in layer M0 of a semiconductor device which has been fabricated based on a larger layout diagram which includes layout diagram 200F of FIG. 2F (where layout diagram 200F is a refinement of layout diagram 200E). A feedthrough conductor extends (in the horizontal direction) across the entirety of at least one cell region (hereinafter, at least one spanned cell region) in order to connect first and second cell regions on opposite sides (relative to the horizontal direction) of the at least one spanned cell region.

A portion 249A of feedthrough pattern 248 is internal to, and spans (in the horizontal direction) an entirety of, P-P cell 202F. A portion 249B of feedthrough pattern 248 is internal to, and spans (in the horizontal direction) an entirety of, P-P cell 232F. In some embodiments, regarding P-P cell 202F, a first end of feedthrough pattern 248 extends (in the horizontal direction) away from side boundary 204B and exterior to side boundary 204D, and into a first extra cell (not shown) which abuts P-P cell 202F at side boundary 204D. In such embodiments, regarding P-P cell 232F, a second end of feedthrough pattern 248 extends (in the horizontal direction) away from side boundary 234D and exterior to side boundary 234B, and into a second extra cell (not shown) which abuts P-P cell 232F at side boundary 234B. Accordingly, in such embodiments, feedthrough pattern 248 is used to connect the first extra cell (not shown) and the second extra cell (not shown).

FIG. 2F is a layout diagram 200F of a refinement of layout diagram 200E (FIG. 2E), in accordance with some embodiments.

Layout diagram 200F of FIG. 2F is similar to layout diagram 200E of FIG. 2E. For brevity, the discussion of layout diagram 200F will focus on differences of layout diagram 200F with respect to layout diagram 200E.

Layout diagram 200F represents a refinement of layout diagram 200E in multiple respects. In at least a first respect, layout diagram 200F represents a refinement of layout diagram 200E, e.g., in terms of not showing wiring patterns 260A-260S of layer M1. Wiring patterns 260A-260S are not shown in FIG. 2F for simplicity of illustration.

In at least a second respect, layout diagram 200F represents a refinement of layout diagram 200E, e.g., in terms of having added dummy patterns in layout diagram 200F relative to layout diagram 200E. Continuing the example of FIG. 2E into FIG. 2F, dummy patterns 209', 213A', 213B' and 217A' have been added to P-P cell 202F and dummy patterns 239', 243' and 247' have been added to P-P cell 232F. Dummy patterns 209', 213A', 213B' and 217A' fill corresponding gaps 209, 213A, 213B and 217A of FIG. 2E. Dummy patterns 239', 243' and 247' fill corresponding gaps 239, 243 and 247 of FIG. 2E. Each of dummy patterns 209', 213A', 213B' and 217A', as well as 239', 243' and 247', represents a dummy structure in a corresponding P-P cell region of a semiconductor device which has been fabricated based on a larger layout diagram which includes layout diagram 200F of FIG. 2F.

In some embodiments, a dummy structure has the shape and orientation of a structure which otherwise would appear to be a conductor but which is not electrically conductive. In some embodiments, a conductor-shaped structure includes a conductor portion which is electrically conductive and a dummy portion which is not electrically conductive. In some embodiments, during fabrication, initially the conductor-shaped structure is not-electrically conductive, and then the conductor portion of the conductor-shaped structure is rendered electrically conductive by a corresponding doping process whereas the dummy portion is masked and remains undoped. In general, replacing empty space along conductor tracks with corresponding dummy patterns results in a dummy-padded layout diagram that exhibits improved pattern density. A semiconductor device which has been fabricated based on a dummy-padded layout diagram, e.g., layout diagram 200F of FIG. 2F, exhibits correspondingly increased structural density. Such a semiconductor device can be planarized more quickly, e.g., because the increased structural density reduces irregularities in surface topography.

In some embodiments, continuing the example of FIG. 2E into FIG. 2F albeit as an alternative to feedthrough pattern 248, dummy pattern 207' (not shown) is also added to P-P cell 202F and dummy pattern 237' also is added to P-P cell 232F. In effect, dummy patterns 207' (not shown) and 237' take the place of wiring patterns 207 and 237 of FIG. 2B (wherein wiring patterns 207 and 237 had been removed in the refinement of FIG. 2C with respect to FIG. 2B). Each of dummy patterns 207' and 237' represents a dummy structure in a corresponding P-P cell region of a semiconductor device which has been fabricated based on a larger layout diagram which includes layout diagram 200F of FIG. 2F.

Layout diagram 200F represents a refinement of layout diagram 200E in at least a third respect, e.g., in terms of having restored some of the previously-removed cut patterns in layout diagram 200F relative to layout diagram 200E. Continuing the example of FIG. 2E into FIG. 2F, cut patterns 228A2-228A5, 228B2, 228B4, 229A2, 229A4 and 229B2-229B5 have been restored in FIG. 2F.

More particularly, in FIG. 2F, cut patterns 228A3-228A5 have been restored in order to impose minimum boundary offset 221 between side boundary 204D of P-P cell 202F and corresponding ends of dummy patterns 207', 209', 213A' and 217A'. Cut patterns 228A3-228A5 also impose minimum end-to-end gap 220 between ends of dummy patterns 207', 209', 213A' and 217A' and ends of corresponding co-track aligned wiring patterns (not shown) in a P-P cell (not shown) which abuts side boundary 204D of P-P cell 202F. Cut pattern 228B4 has been restored in order to impose minimum boundary offset 221 between side boundary 204B of P-P cell 202F and the corresponding end of dummy pattern 213B'. Cut pattern 228B4 also imposes minimum end-to-end gap 220 between corresponding ends of dummy pattern 213B' and co-track aligned wiring pattern 242'. Cut pattern 229A4 has been restored in order to impose minimum boundary offset 221 between side boundary 234D of P-P cell 232F and the corresponding end of wiring pattern 242'. Cut pattern 229A4 also imposes minimum end-to-end gap 220 between corresponding ends of wiring pattern 242' and co-track aligned dummy pattern 213B'. Cut patterns 229B3-229B5 have been restored in order to impose minimum boundary offset 221 between side boundary 234B and corresponding ends of wiring pattern 238' and dummy patterns 243' and 247'. Cut patterns 229B3-229B5 also impose minimum end-to-end gap 220 between ends of wiring pattern 238' and dummy patterns 243' and 247' and corresponding ends of co-track aligned wiring patterns (not shown) in a P-P cell (not shown) which abuts side boundary 234B of P-P cell 232F.

Regarding layout diagram 200F, in some embodiments, for a given pair of given first and second cut patterns which are immediately adjacent to each other (in the horizontal direction), there is a third design rule that the first and second given cut patterns in the given pair are to be separated by at least a minimum cut spacing (in the horizontal direction). If a contemplated location for a first contemplated cut pattern does not exhibit the minimum cut spacing with respect to a second contemplated cut pattern, then the first contemplated cut pattern cannot be located in the contemplated location unless the contemplated second cut pattern were to be appropriately relocated (assuming that such relocation was itself permissible).

In FIG. 2F, it is assumed that all cut patterns satisfy the minimum cut spacing. In particular, the following is assumed: cut pattern 228D satisfies the minimum cut spacing with respect to each of corresponding cut patterns 228A5; cut pattern 228D satisfies the minimum cut spacing with respect to each of corresponding cut patterns 228C and 229C; cut pattern 229D satisfies the minimum cut spacing with respect to cut pattern 229B3; and cut pattern 229C satisfies the minimum cut spacing with respect to each of corresponding cut patterns 228D and 229B5.

In some embodiments, continuing the example of FIG. 2E into FIG. 2F albeit in the context of the alternative to feedthrough pattern 248, cut patterns 228A2 (not shown), 228B2 (not shown), 229A2 (not shown) and 229B2 (not shown) have been restored. More particularly, cut pattern 228A2 (not shown) has been restored in order to impose minimum boundary offset 221 between side boundary 204D of P-P cell 202F and the corresponding end of dummy pattern 207'. Cut pattern 228A2 also imposes minimum end-to-end gap 220 between corresponding ends of dummy pattern 207' and co-track aligned wiring pattern (not shown) in a P-P cell (not shown) which abuts side boundary 204D of P-P cell 202F. Cut patterns 228B2 has been restored in order to impose minimum boundary offset 221 between side boundary 204B of P-P cell 202F and the corresponding end of dummy pattern 207'. Cut pattern 228B2 also imposes minimum end-to-end gap 220 between the ends of dummy pattern 207' and co-track aligned dummy pattern 237'. Cut pattern 229A2 has been restored in order to impose minimum boundary offset 221 between side boundary 234D of P-P cell 232F and the corresponding end of dummy pattern 237'. Cut patterns 229A2 also imposes minimum end-to-end gap 220 between corresponding ends of dummy patterns 237' and co-track aligned dummy pattern 207'. Cut pattern 229B2 has been restored in order to impose minimum boundary offset 221 between side boundary 234B and the corresponding end of dummy pattern 237'. Cut pattern 229B2 also imposes minimum end-to-end gap 220 between corresponding ends of dummy pattern 237' and co-track aligned wiring pattern (not shown) in a P-P cell (not shown) which abuts side boundary 234B of P-P cell 232F.

Layout diagram 200F represents a refinement of layout diagram 200E in at least a fourth respect, e.g., in terms of having added new cut patterns in layout diagram 200F relative to layout diagram 200E. Continuing the example of FIG. 2E into FIG. 2F, cut patterns 228D and 229D have been added to corresponding P-P cells 202F and 232F. More particularly, cut pattern 228D has been added to impose minimum end-to-end gap 220 between corresponding ends of wiring pattern 216B' of P-P cell 202F and pin pattern 246" of P-P cell 232F. Cut pattern 229D has been added to impose minimum end-to-end gap 220 between corresponding ends of p-pin pattern 208" of P-P cell 202F and dummy pattern 239' of P-P cell 232F.

Regarding FIG. 2F, for a P-P cell region (e.g., P-P cell region 104) included in a semiconductor device (e.g., semiconductor device 100 of FIG. 1) which has been fabricated based on a larger layout diagram which includes layout diagram 200F, components (e.g., 313B' 308" and 306 corresponding in cell 202F to dummy pattern 213B', p-pin pattern 208" and intra-cell wiring pattern 206, as well as components (not shown) corresponding in cell 202F to intra-cell wiring patterns 212' and 216A' and dummy patterns 209', 213A', and 217A') have an arrangement (not shown). The arrangement is such that a virtual perimeter is drawable around substantially all of the components. Such a virtual perimeter is rectangular and includes a first virtual side boundary (e.g., side boundary 204B) and a second virtual side boundary (e.g., side boundary 204D) which are substantially parallel and extend in a first direction. The components of such a P-P cell region include a first conductor (e.g., pin 308" corresponding to p-pin pattern 208") which extends in the first direction. A portion (e.g., e.g. corresponding to portion 208P of p-pin pattern 208") of the first conductor has a first end which extends exterior to the first virtual side boundary by a protrusion length which is substantially greater than a minimum virtual boundary offset (e.g., corresponding to minimum boundary offset 221).

In some embodiments, semiconductor devices fabricated based on corresponding larger layout diagrams which include a layout diagram such as layout diagram 200F of FIG. 2F, and thus include P-P cells such as P-P cell 202F and/or 232F, beneficially exhibit approximately 20% improvement in pin accessibility. In some embodiments, semiconductor devices fabricated based on corresponding larger layout diagrams which include a layout diagram such as layout diagram 200F of FIG. 2F, and thus include P-P cells such as P-P cell 202F and/or 232F, beneficially exhibit approximately 5% improvement in utilization, e.g., approximately 5% improvement in terms of power-performance-area (PPA).

Together, an effect of the refinements reflected in layout diagrams 200A-200C of corresponding FIGS. 2A-2C can be described as having started with shells and then having expanded the free space on H-tracks of layer M0 by removing, in whole or partially, portions of one or more corresponding wiring patterns in layer M0. An effect of the refinements reflected in layout diagrams 200D-200E of corresponding FIGS. 2D-2E can be described as routing in general, and more particularly as routing in order to establish connections to corresponding wiring patterns in layer M1. An effect of the refinements reflected in layout diagram 200F of corresponding FIG. 2F can be described as backfilling with dummy patterns. Overall, a method manifested in the refinements reflected in layout diagrams 200A-200F of corresponding FIGS. 2A-2F can be described as M0 post-routing dummy-backfilling.

Figure 3A:
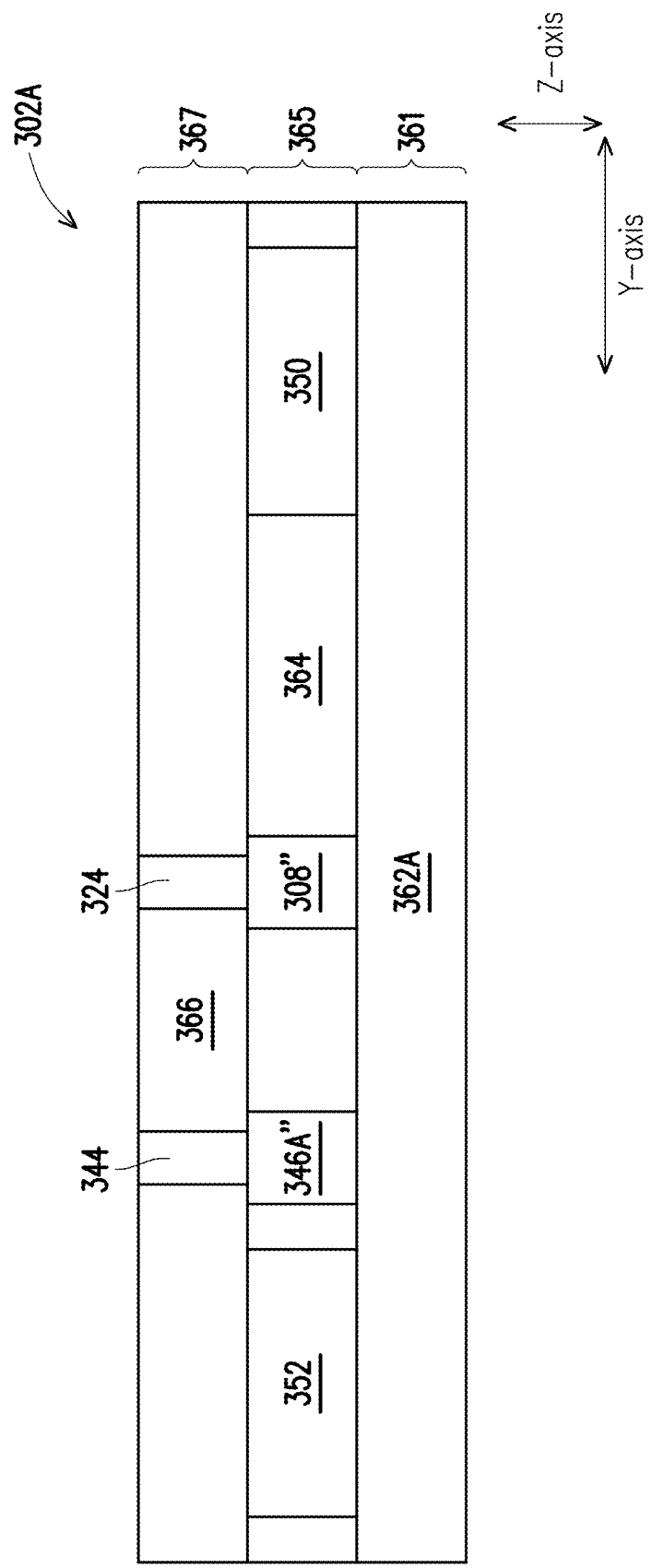
FIG. 3A is a cross-section of a cell region of a semiconductor device, in accordance with some embodiments.

FIG. 3A is a cross-section of a P-P cell region 302A of a semiconductor device, in accordance with some embodiments.

P-P cell region 302A is an example of a cell region of a semiconductor device which is fabricated based on a larger layout diagram which includes a smaller layout diagram such as the layout diagrams disclosed herein, e.g., layout diagram 200E of FIG. 2E. As such, P-P cell region 302A is an example of cell region 104 of semiconductor device 100 of FIG. 1.

P-P cell region 302A includes layers 361, 365 and 367. Layer 365 is formed on layer 361. Layer 367 is formed on layer 365. Layer 361 represents a transistor layer in which transistors are formed. In some embodiments, layer 361 includes corresponding sub-layers (not shown). The sub-layers include component patterns (not shown) corresponding to components, e.g., transistors, of a circuit that would result from a larger layout diagram which includes a smaller layout diagram, e.g., layout diagram 200E of FIG. 2E (where layout diagram 200E is a refinement of layout diagrams 200A-200D).

In FIG. 3A, layer 365 represents a first layer of metallization, M_1st, in a semiconductor device having been fabricated based on a larger layout diagram which includes a smaller layout diagram, e.g., layout diagram 200E of FIG. 2E. In some embodiments, depending upon the numbering convention of the corresponding process node by which such a semiconductor device is fabricated, the first (1st) layer of metallization M_1st is either metallization layer zero, M0, or metallization layer one, M1. Consistent with FIGS. 2A-2F, in FIG. 3A, M_1st is assumed to be M0 such that layer 365 represents layer M0 of metallization. Layer 367 represents an interconnect layer inserted between layers 365 and layer M1 of metallization (not shown in FIG. 3A).

Layer 365 of FIG. 3A includes conductors 352, 346A", 308" and 350, and an interlayer dielectric (ILD) 364. Conductors 352, 346A", 308" and 350 correspond to PG pattern 252, p-pin pattern 246A", p-pin pattern 208" and PG pattern 250 in layout diagram 200E of FIG. 2E. Layer 367 includes vias 344 and 324, and an interlayer dielectric (ILD) 366. Each of vias 344 and 324 is an electrically conductive structure. Vias 344 and 324 correspond to via patterns 244 and 224 in layout diagram 200E of FIG. 2E. Vias 344 and 324 are substantially centered over corresponding conductors 346A" and 308" so as to electrically connect conductors 346A" and 308" to corresponding conductors (not shown) in layer M1 (again, not shown in FIG. 3A).

Figure 3B:
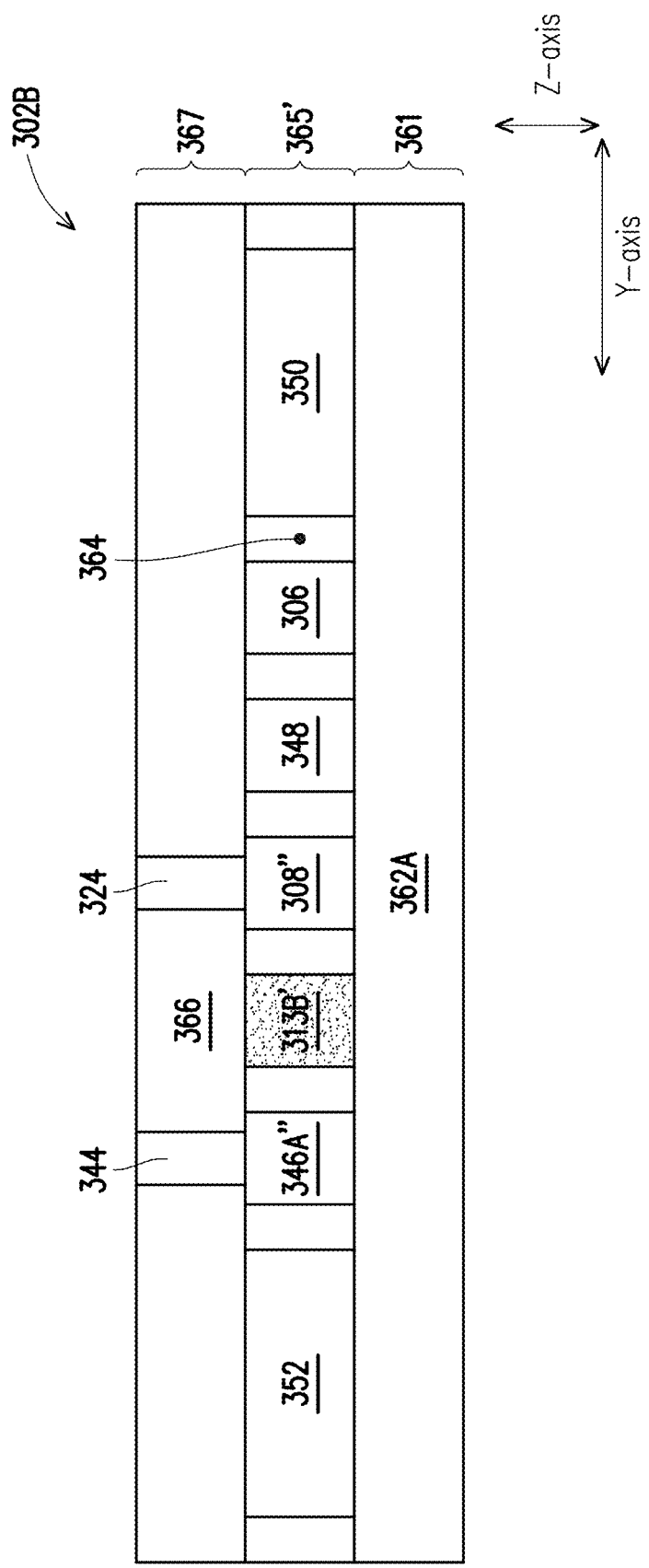
FIG. 3B is a cross-section of a cell region of a semiconductor device, in accordance with some embodiments.

FIG. 3B is a cross-section of a P-P cell region 302B of a semiconductor device, in accordance with some embodiments.

The cross-section of P-P cell region 302B of FIG. 3B is similar to the cross-section of cell region 302A of FIG. 3A. For brevity, the discussion of FIG. 3B will focus on differences of FIG. 3B with respect to FIG. 3A.

P-P cell region 302B is an example of a cell region of a semiconductor device which is fabricated based on a larger layout diagram which includes a smaller layout diagram such as the layout diagrams disclosed herein, e.g., layout diagram 200F of FIG. 2F. As such, P-P cell region 302B is an example of cell region 104 of semiconductor device 100 of FIG. 1.

In FIG. 3B, relative to layer 365 of FIG. 3A, dummy structure 313B', conductor 348 and conductor 306 have been added resulting in layer 365'. Dummy structure 313B' corresponds to dummy pattern 213B' in layout diagram 200F of FIG. 2F. Conductor 348 corresponds to feedthrough pattern 248 in layout diagram 200F of FIG. 2F. Conductor 306 corresponds to intra-cell wiring pattern 206 in layout diagram 200F of FIG. 2F.

Figure 4:
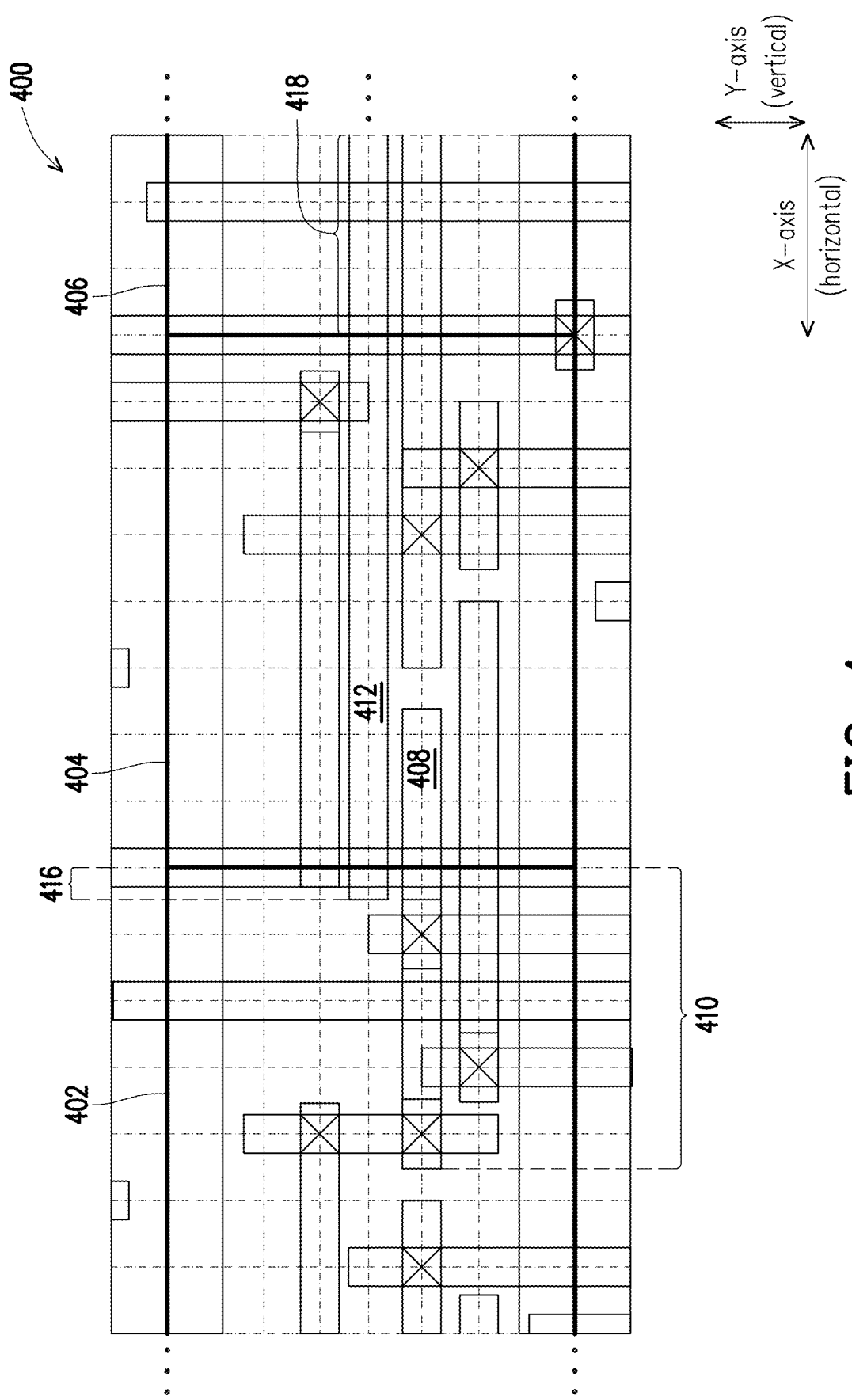
FIG. 4 is a layout diagram, in accordance with some embodiments.

FIG. 4 is a layout diagram 400, in accordance with some embodiments.

Layout diagram 400 represents a portion of a larger layout diagram. An example of a semiconductor device having been fabricated based on a larger layout diagram which includes layout diagram 400 of FIG. 4 is semiconductor device 100 of FIG. 1, where an example of a P-P cell region 104 corresponds to cell 404.

In FIG. 4, layout diagram 400 includes cells 402, 404 and 406. Each of cells 402, 404 and 406 represents a corresponding function of a semiconductor device having been fabricated based on a larger layout diagram which includes layout diagram 400 of FIG. 4. In some embodiments, the function of one or more of cells 402, 404 and 406 is a corresponding Boolean logic function. In some embodiments, the function of one or more of cells 402, 404 and 406 is a corresponding storage function.

In layout diagram 400, each of cells 402, 404 and 406 is rectangular. Relative to a first direction, which is the horizontal direction in FIG. 4, cells 402 and 404 are abutting and cells 404 and 406 are abutting. In some embodiments, the first direction is a direction other than the horizontal direction. Each of cells 402, 404 and 406 includes various first type wiring patterns and various second type wiring patterns. Long axes of the various first type wiring patterns are substantially parallel to the horizontal direction. Long axes of the various second type wiring patterns are substantially parallel to the vertical direction. In some embodiments, the first direction is a direction other than the horizontal direction and the second direction is substantially perpendicular to the first direction.

In FIG. 4, the various first type wiring patterns represent corresponding conductors included in a first layer of metallization, M_1st, for a semiconductor device having been fabricated based on a larger layout diagram which includes a smaller layout diagram, e.g., layout diagram 400. In some embodiments, depending upon the numbering convention of the corresponding process node by which such a semiconductor device is fabricated, the first (1st) layer of metallization M_1st is either metallization layer zero, M0, or metallization layer one, M1. Consistent with FIGS. 2A-2F and 3A-3B, in FIG. 4, M_1st is assumed to be M0 such that the first type wiring patterns represent conductors in layer M0 of metallization and the second type wiring patterns represent wiring conductors in layer M1 of metallization.

In FIG. 4, the first type wiring patterns include wiring patterns 408 and 412. In particular, wiring pattern 408 is included in cell 404. Wiring pattern 408 is an example of a p-pin pattern, and accordingly cell 404 is an example of a P-P cell. Relative to the horizontal direction, a portion 410 of p-pin pattern 408 extends external to P-P cell 404 into cell 402. Wiring pattern 412 is an example of a feedthrough pattern. Feedthrough pattern 412 extends across the entirety of P-P cell 404. Relative to the horizontal direction: a first portion 416 of feedthrough pattern 412 extends beyond P-P cell 404 into cell 402; and a second portion 418 of feedthrough pattern 412 extends beyond cell P-P 404 into cell 406.

In some embodiments, P-P cell 404 is an example result of an embodiment of an M0 post-routing dummy-backfilling method (described above, but also see FIGS. 6-7. In some embodiments, the inclusion of feedthrough pattern 412 is an example result of an embodiment of an M0 post-routing dummy-backfilling method (described above, but also see FIGS. 6-7).

Figure 5:
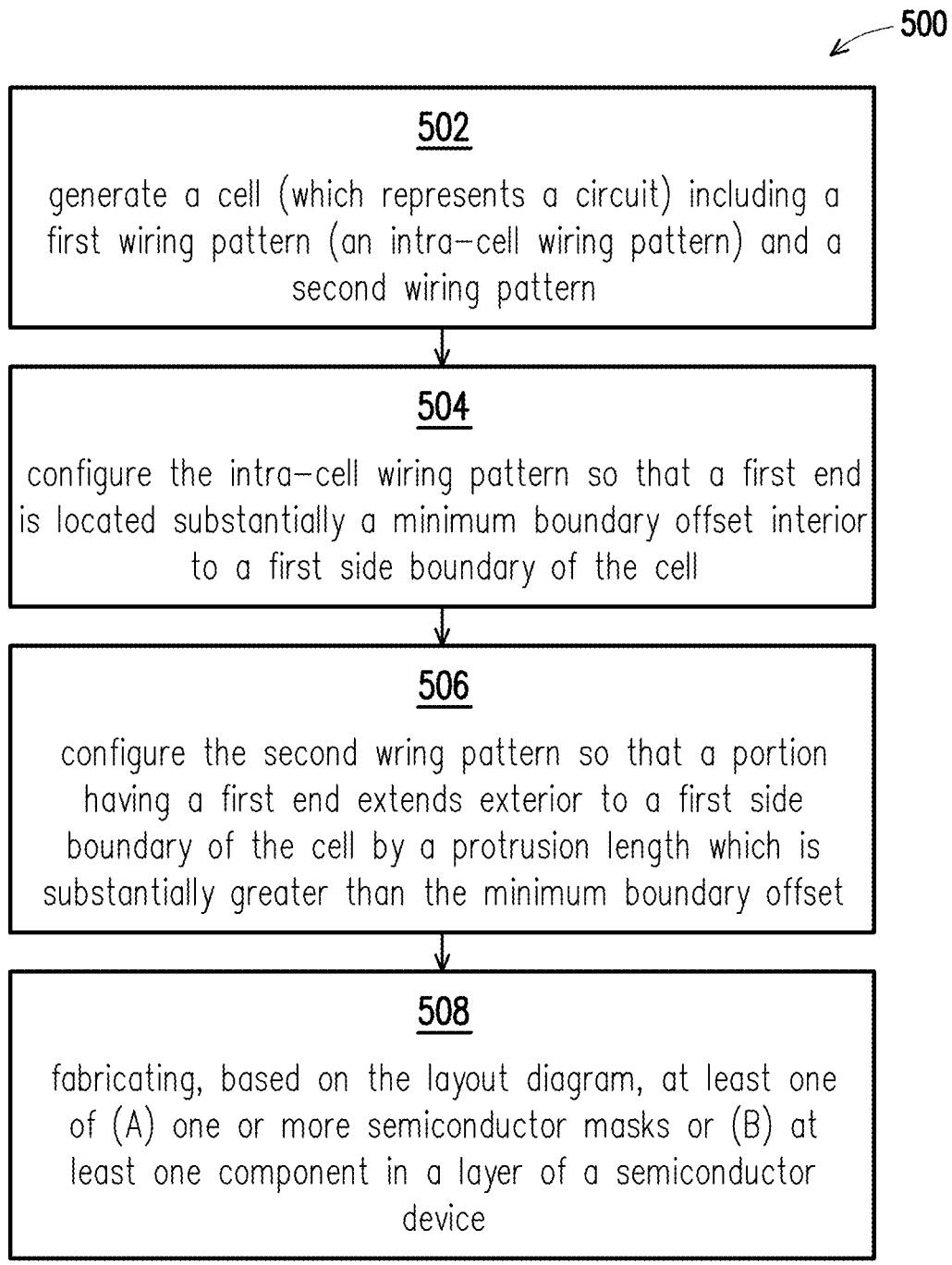
FIG. 5 is a flowchart of a method of generating a layout diagram, in accordance with some embodiments.

FIG. 5 is a flowchart of a method 500 of generating a layout diagram, in accordance with some embodiments.

Method 500 is implementable, for example, using EDA system 800 (FIG. 8, discussed below), in accordance with some embodiments. Regarding method 500, an example of the layout diagram is layout diagram 200F of FIG. 2F.

Method 500 includes blocks 502-508. At block 502, a cell is generated which represents a circuit. The cell includes a first and second wiring patterns. The first wiring pattern is an intra-cell wiring pattern. An example of the cell is cell 202E of FIG. 2E. The cell includes first and second side boundaries which are substantially parallel and extend in a first direction. An example of the first direction is the vertical direction. Examples of the first and second side boundaries are corresponding side boundaries 204B and 204D. An example of the intra-cell wiring pattern is intra-cell wiring pattern 206. An example of the second wiring pattern is p-pin pattern 208". From block 502, flow proceeds to block 504.

At block 504, the intra-cell wiring pattern is configured so that a first end is located substantially a minimum boundary offset interior to the first side boundary. An example of the minimum boundary offset is minimum boundary offset 221 of FIG. 2F. In some embodiments, the minimum boundary offset is substantially half of a minimum end-to-end spacing for substantially collinear wiring patterns. An example of the minimum end-to-end spacing is minimum end-to-end gap 220 of FIG. 2F. In some embodiments, the intra-cell wiring pattern is further configured so that a second end of the intra-cell wiring pattern is located substantially the minimum boundary offset from the second side boundary of the cell.

In some embodiments, the intra-cell wiring pattern is further configured to leave a gap between a second end of the intra-cell wiring pattern and the second side boundary of the cell. In some embodiments, a size of the gap in the second direction is substantially greater than the minimum boundary offset. In such embodiments, an example of the cell is cell 232F of FIG. 2F, an example of the second side boundary is side boundary 232B, an example of the intra-cell wiring pattern is wiring pattern 242' of FIG. 2F and an example of the gap is gap 243 of FIG. 2E. In some embodiments, the method further includes substantially filling the gap with a dummy pattern; configuring the dummy pattern so that a first end thereof substantially abuts the second end of the wiring pattern; and further configuring the dummy pattern so that a second end thereof is located substantially the minimum boundary offset interior to the second side boundary. An example of the dummy pattern is dummy pattern 243'.

In some embodiments, the intra-cell wiring pattern is a first intra-cell wiring pattern, and the method further includes: adding, to the cell, a third wiring pattern which is a second intra-cell wiring pattern and which extends in the second direction; and adding, to the cell, a cut pattern which extends in the first direction and which, in effect, divides the second intra-cell wiring pattern into first and second portions. First ends of the first and second portions of the second intra-cell wiring pattern are located proximal to the cut pattern. An example of the second intra-cell wiring pattern before the addition of the cut pattern is wiring pattern 216 of FIG. 2A. An example of the cut pattern is cut pattern 228C of FIG. 2B. Examples of the first and second portions of the second wiring pattern are corresponding wiring patterns 216A and 216B of FIG. 2B. In some embodiments, the first portion has a second end which is distal to the cut pattern; and the second portion of the second intra-cell wiring pattern is configured to leave a gap (217A) between the second end and the second side boundary. In some embodiments, a size of the gap (217A) in the second direction is substantially greater than the minimum boundary offset. An example of the gap is gap 217A of FIG. 2C. In some embodiments, the method further includes substantially filling the gap with a dummy pattern (217A'); configuring the dummy pattern so that a first end thereof substantially abuts a second end of the second wiring pattern; and further configuring the dummy pattern so that a second end thereof is located substantially the minimum boundary offset interior to the second side boundary. An example of the dummy pattern is dummy pattern 217A' of FIG. 2F.

From block 504, flow proceeds to block 506. At block 506, the second wiring pattern is configured so that a portion thereof has a first end which extends exterior to the first side boundary by a protrusion length which is substantially greater than the minimum boundary offset. An example of the portion which extends exterior is portion 208P of FIG. 2E. In some embodiments, the second wiring pattern is configured to leave a gap between a second end thereof and the second side boundary. A size of the gap in the second direction is substantially greater than the minimum boundary offset. An example of the gap is gap 209 of FIG. 2C. In some embodiments, the method further includes: substantially filling the gap with a dummy pattern; configuring the dummy pattern so that a first end thereof substantially abuts a second end of the second wiring pattern; and further configuring the dummy pattern so that a second end thereof is located substantially the minimum boundary offset interior to the second side boundary. An example of the dummy pattern is dummy pattern 209'.

From block 506, flow proceeds to block 508. At block 508, based on the layout diagram, at least one of (A) one or more semiconductor masks or (B) at least one component in a layer of a semiconductor device is fabricated. See discussion below of FIG. 7.

Figure 6:
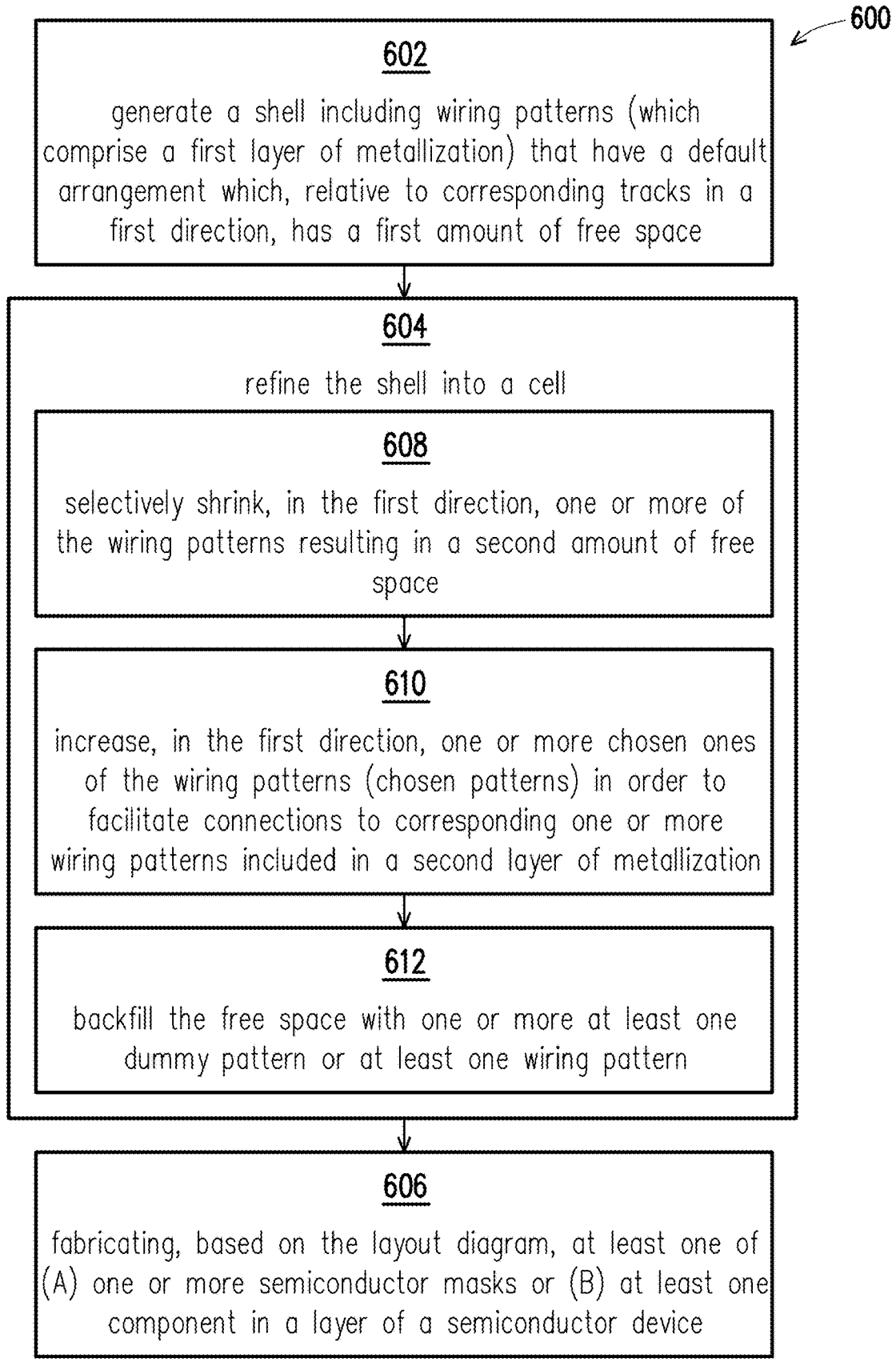
FIG. 6 is a flowchart of a method of generating a layout diagram, in accordance with some embodiments.

FIG. 6 is a flowchart of a method 600 of generating a layout diagram, in accordance with some embodiments.

Method 600 is implementable, for example, using EDA system 800 (FIG. 8, discussed below), in accordance with some embodiments. Regarding method 600, an example of the layout diagram is layout diagram 200F of FIG. 2F.

In FIG. 6, method 600 includes blocks 602-612. At block 602, a shell is generated which includes wiring patterns. The wiring patterns comprise a first layer of metallization. The wiring patterns have a default arrangement which, relative to a first direction, has a first amount of free space. An example of the shell is shell 202A of FIG. 2A. Examples of the wiring patterns are wiring patterns 206, 207, 208, 212 and 216 of FIG. 2A. An example of the first layer of metallization is M0, as in FIGS. 2A-2F.

The wiring patterns have long axes which are substantially aligned with corresponding tracks that extend in a first direction. An example of the first direction is the horizontal direction. Examples of the tracks are H-Tracks T(i−2), T(i−1), T(i), T(i+1) and T(i+2). The shell includes first and second side boundaries which are substantially parallel and extend in a second direction. An example of the second direction is the vertical direction. Examples of the first and second side boundaries are corresponding side boundaries 204B and 204D. From block 602, flow proceeds to block 604.

At block 604, the shell is refined into a cell. An example of the cell is cell 202F of FIG. 2F. Block 604 includes blocks 608-612. Within block 604, at block 608, one or more of the wiring patterns is selectively shrunk in the first direction, resulting in a second amount of free space. The second amount of free space is greater than the first amount of free space. Examples of the one or more wiring patterns which get shrunk are wiring patterns 208, 212 and 216 of FIG. 2A, resulting in corresponding gaps 209, 213A, 213B, 217A and 217B as well as corresponding wiring patterns 208', 212' and 216' of FIG. 2C. An example of the second amount of free space is the amount of free space in cell 202C of FIG. 2C, which (by inspection) is greater than the amount of free space in shell 202A of FIG. 2A. From block 608, flow proceeds to block 610.

At block 610, one or more chosen ones of the wiring patterns (chosen patterns) are increased in the first direction in order to facilitate connection to corresponding one or more wiring patterns included in a second layer of metallization. An example of a chosen pattern is pin pattern 208' of FIG. 2D. An example of the second layer of metallization is M1, as in FIG. 2D. From block 610, flow proceeds to block 612. In some embodiments, an example of a chosen patterns is a trans-boundary intra-cell wiring pattern. In some embodiments, the method further includes adding one or more via patterns (224, 244) representing correspondingly one or more connections between the corresponding one or more chosen patterns of the first layer of metallization and the corresponding one or more wiring patterns included in the second layer of metallization. An example of the via pattern is via pattern 224.

In some embodiments, the cell includes: first (right=204B) and second (left=204D) side boundaries which are substantially parallel and extend in a second direction (vertical). An example of the second direction is the vertical direction. Examples of the first and second side boundaries are corresponding first side boundary 204B and second side boundary 204D. In some embodiments, the increasing includes expanding, in the first direction (horizontal), a given one of the chosen patterns so that a portion thereof has a first end which extends exterior to the first side boundary by a protrusion length which is substantially greater than the minimum boundary offset. An example of a chosen pattern is pin pattern 208' of FIG. 2D, resulting in p-pin pattern 208" of FIG. 2E, which has a portion 208P which extends exterior to side boundary 204B of cell 202E.

At block 612, the free space (again, relative to the corresponding tracks) is backfilled with dummy patterns. Examples of the dummy patterns are dummy patterns 209', 213A', 213B,' 217A' and 217B' which substantially fill corresponding gaps 209, 213A, 213B, 217A and 217B. From block 612, flow leaves block 604.

In some embodiments, the refining further includes selectively removing an entirety of one (207) of the wiring patterns (207, 208, 212, 216, 237, 238, 242 and 246); so as to leave the corresponding track empty; and the backfilling the free space includes backfilling the empty track with a wiring pattern which is a feedthrough pattern that extends in the first direction across an entirety of cell (202E) as well as exterior to the first (right=204B) and second (left=204D) side boundaries. An example of a wiring pattern removed in its entirety is wiring pattern 207 of FIG. 2A. An example of the feedthrough pattern is feedthrough pattern 248 of FIG. 2E, resulting in p-pin pattern 208" of FIG. 2E, which has portions that extend exterior to side boundary 204B and exterior to side boundary 204D.

From block 604, flow proceeds to block 606. At block 606, based on the layout diagram, at least one of (A) one or more semiconductor masks or (B) at least one component in a layer of a semiconductor device is fabricated. See discussion below of FIG. 7.

Figure 7:
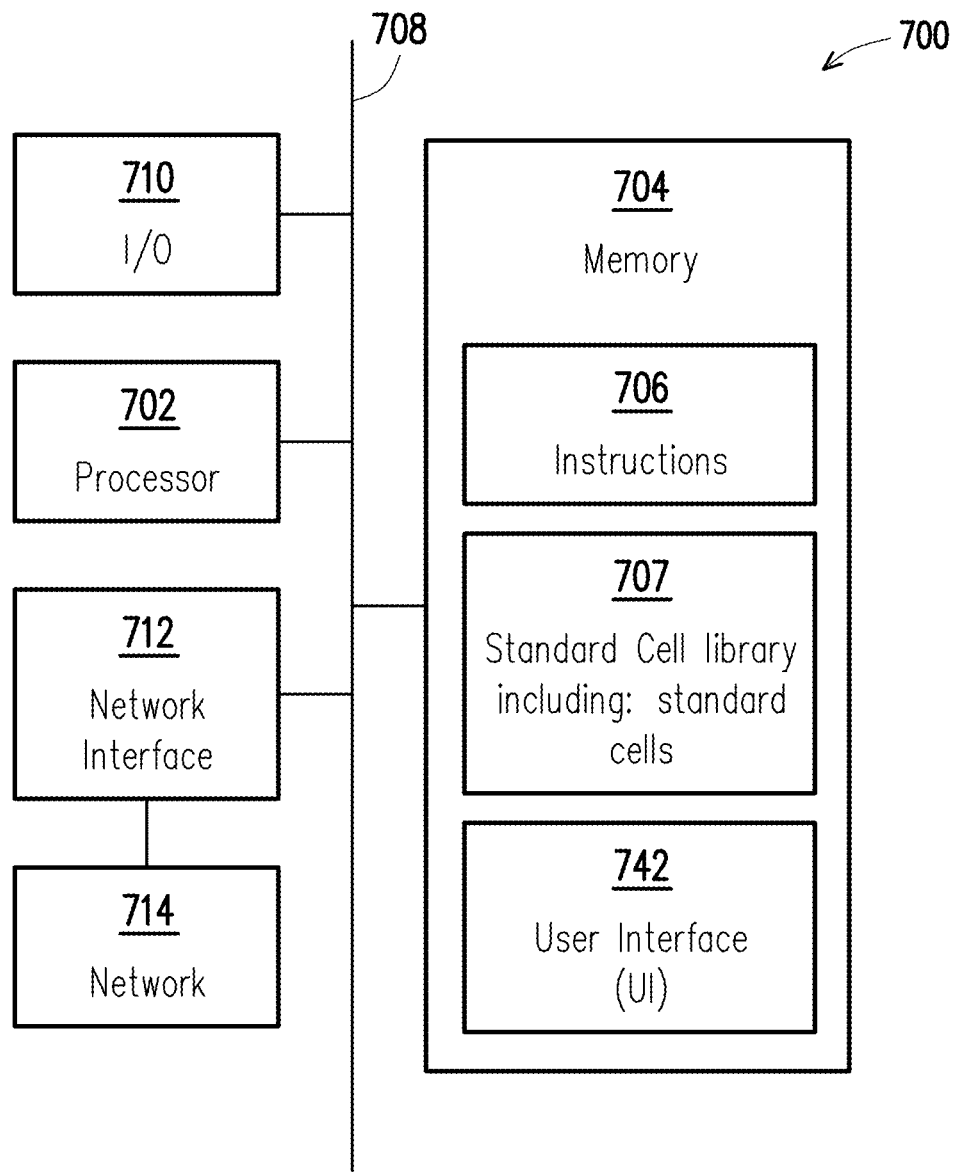
FIG. 7 is a block diagram of an electronic design automation (EDA) system in accordance with some embodiments.

FIG. 7 is a block diagram of an electronic design automation (EDA) EDA system 700 in accordance with some embodiments.

In some embodiments, EDA system 700 includes an APR system. Methods described herein of designing layout diagrams represent wire routing arrangements, in accordance with one or more embodiments, are implementable, for example, using EDA system 700, in accordance with some embodiments.

In some embodiments, EDA system 700 is a general purpose computing device including a hardware processor 702 and a non-transitory, computer-readable storage medium 704. Storage medium 704, amongst other things, is encoded with, i.e., stores, computer program code 706, where computer program code 706 is a set of computer-executable instructions. Execution of computer program code 706 by processor 702 represents (at least in part) an EDA tool which implements a portion or all of, e.g., the methods described herein in accordance with one or more (hereinafter, the noted processes and/or methods).

Processor 702 is electrically coupled to computer-readable storage medium 704 via a bus 708. Processor 702 is also electrically coupled to an I/O interface 710 by bus 708. A network interface 712 is also electrically connected to processor 702 via bus 708. Network interface 712 is connected to a network 714, so that processor 702 and computer-readable storage medium 704 are capable of connecting to external elements via network 714. Processor 702 is configured to execute computer program code 706 encoded in computer-readable storage medium 704 in order to cause EDA system 700 to be usable for performing a portion or all of the noted processes and/or methods. In one or more embodiments, processor 702 is a central processing unit (CPU), a multi-processor, a distributed processing system, an application specific integrated circuit (ASIC), and/or a suitable processing unit.

In one or more embodiments, computer-readable storage medium 704 is an electronic, magnetic, optical, electromagnetic, infrared, and/or a semiconductor system (or apparatus or device). For example, computer-readable storage medium 704 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 704 includes a compact disk-read only memory (CD-ROM), a compact disk-read/write (CD-R/W), and/or a digital video disc (DVD).

In one or more embodiments, storage medium 704 stores computer program code 706 configured to cause EDA system 700 (where such execution represents (at least in part) the EDA tool) to be usable for performing a portion or all of the noted processes and/or methods. In one or more embodiments, storage medium 704 also stores information which facilitates performing a portion or all of the noted processes and/or methods. In one or more embodiments, storage medium 704 stores library 707 of standard cells including such standard cells corresponding to cells disclosed herein.

EDA system 700 includes I/O interface 710. I/O interface 710 is coupled to external circuitry. In one or more embodiments, I/O interface 710 includes a keyboard, keypad, mouse, trackball, trackpad, touchscreen, and/or cursor direction keys for communicating information and commands to processor 702.

EDA system 700 also includes network interface 712 coupled to processor 702. Network interface 712 allows EDA system 700 to communicate with network 714, to which one or more other computer systems are connected. Network interface 712 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 700.

EDA system 700 is configured to receive information through I/O interface 710. The information received through I/O interface 710 includes one or more of instructions, data, design rules, libraries of standard cells, and/or other parameters for processing by processor 702. The information is transferred to processor 702 via bus 708. EDA system 700 is configured to receive information related to a UI through I/O interface 710. The information is stored in computer-readable medium 704 as user interface (UI) 742.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 700. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 8:
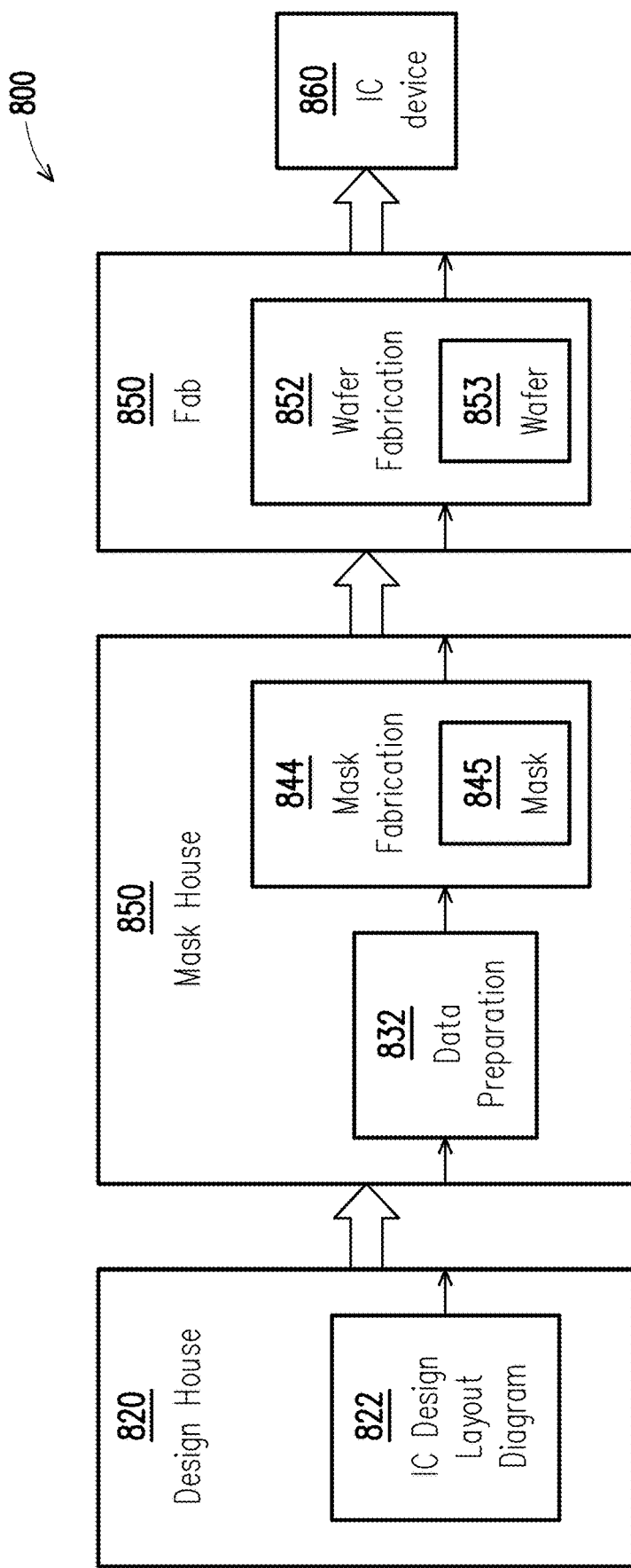
FIG. 8 is a block diagram of a semiconductor device manufacturing system, and an IC manufacturing flow associated therewith, in accordance with some embodiments.

FIG. 8 is a block diagram of semiconductor device, e.g., an integrated circuit (IC), manufacturing system 800, and an IC manufacturing flow associated therewith, in accordance with some embodiments.

In some embodiments, based on a layout diagram, at least one of (A) one or more semiconductor masks or (B) at least one component in a layer of a semiconductor integrated circuit is fabricated using manufacturing system 800.

In FIG. 8, IC manufacturing system 800 includes entities, such as a design house 820, a mask house 830, and an IC manufacturer/fabricator ("fab") 850, that interact with one another in the design, development, and manufacturing cycles and/or services related to manufacturing an IC device 860. The entities in system 800 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 820, mask house 830, and IC fab 850 is owned by a single larger company. In some embodiments, two or more of design house 820, mask house 830, and IC fab 850 coexist in a common facility and use common resources.

Design house (or design team) 820 generates an IC design layout diagram 822. IC design layout diagram 822 includes various geometrical patterns designed for an IC device 860. The geometrical patterns correspond to patterns of metal, oxide, or semiconductor layers that make up the various components of IC device 860 to be fabricated. The various layers combine to form various IC features. For example, a portion of IC design layout diagram 822 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 820 implements a proper design procedure to form IC design layout diagram 822. The design procedure includes one or more of logic design, physical design or place and route. IC design layout diagram 822 is presented in one or more data files having information of the geometrical patterns. For example, IC design layout diagram 822 can be expressed in a GDSII file format or DFII file format.

Mask house 830 includes data preparation 832 and mask fabrication 844. Mask house 830 uses IC design layout diagram 822 to manufacture one or more masks 845 to be used for fabricating the various layers of IC device 860 according to IC design layout diagram 822. Mask house 830 performs mask data preparation 832, where IC design layout diagram 822 is translated into a representative data file ("RDF"). Mask data preparation 832 provides the RDF to mask fabrication 844. Mask fabrication 844 includes a mask writer. A mask writer converts the RDF to an image on a substrate, such as a mask (reticle) 845 or a semiconductor wafer 853. The design layout diagram 822 is manipulated by mask data preparation 832 to comply with particular characteristics of the mask writer and/or requirements of IC fab 850. In FIG. 8, mask data preparation 832 and mask fabrication 844 are illustrated as separate elements. In some embodiments, mask data preparation 832 and mask fabrication 844 can be collectively referred to as mask data preparation.

In some embodiments, mask data preparation 832 includes optical proximity correction (OPC) which uses lithography enhancement techniques to compensate for image errors, such as those that can arise from diffraction, interference, other process effects and the like. OPC adjusts IC design layout diagram 822. In some embodiments, mask data preparation 832 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 832 includes a mask rule checker (MRC) that checks the IC design layout diagram 822 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 822 to compensate for limitations during mask fabrication 844, which may undo part of the modifications performed by OPC in order to meet mask creation rules.

In some embodiments, mask data preparation 832 includes lithography process checking (LPC) that simulates processing that will be implemented by IC fab 850 to fabricate IC device 860. LPC simulates this processing based on IC design layout diagram 822 to create a simulated manufactured device, such as IC device 860. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 822.

It should be understood that the above description of mask data preparation 832 has been simplified for the purposes of clarity. In some embodiments, data preparation 832 includes additional features such as a logic operation (LOP) to modify the IC design layout diagram 822 according to manufacturing rules. Additionally, the processes applied to IC design layout diagram 822 during data preparation 832 may be executed in a variety of different orders.

After mask data preparation 832 and during mask fabrication 844, a mask 845 or a group of masks 845 are fabricated based on the modified IC design layout diagram 822. In some embodiments, mask fabrication 844 includes performing one or more lithographic exposures based on IC design layout diagram 822. In some embodiments, an electron-beam (e-beam) or a mechanism of multiple e-beams is used to form a pattern on a mask (photomask or reticle) 845 based on the modified IC design layout diagram 822. Mask 845 can be formed in various technologies. In some embodiments, mask 845 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 845 includes a transparent substrate (e.g., fused quartz) and an opaque material (e.g., chromium) coated in the opaque regions of the binary mask. In another example, mask 845 is formed using a phase shift technology. In a phase shift mask (PSM) version of mask 845, various features in the pattern formed on the phase shift mask are configured to have proper phase difference to enhance the resolution and imaging quality. In various examples, the phase shift mask can be attenuated PSM or alternating PSM. The mask(s) generated by mask fabrication 844 is used in a variety of processes. For example, such a mask(s) is used in an ion implantation process to form various doped regions in semiconductor wafer 853, in an etching process to form various etching regions in semiconductor wafer 853, and/or in other suitable processes.

IC fab 850 includes wafer fabrication 852. IC fab 850 is an IC fabrication business that includes one or more manufacturing facilities for the fabrication of a variety of different IC products. In some embodiments, IC Fab 850 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 850 uses mask(s) 845 fabricated by mask house 830 to fabricate IC device 860. Thus, IC fab 850 at least indirectly uses IC design layout diagram 822 to fabricate IC device 860. In some embodiments, semiconductor wafer 853 is fabricated by IC fab 850 using mask(s) 845 to form IC device 860. In some embodiments, the IC fabrication includes performing one or more lithographic exposures based at least indirectly on IC design layout diagram 822. Semiconductor wafer 853 includes a silicon substrate or other proper substrate having material layers formed thereon. Semiconductor wafer 853 further includes one or more of various doped regions, dielectric features, multi-level interconnects, and the like (formed at subsequent manufacturing steps).

Details regarding an integrated circuit (IC) manufacturing system (e.g., system 800 of FIG. 8), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference. It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

In an embodiment, a method (of generating a layout diagram, the layout diagram being stored on a non-transitory computer-readable medium) includes: generating a shell including wiring patterns in a first layer of metallization, the wiring patterns having long axes which are substantially aligned with corresponding tracks that extend in a first direction, the wiring patterns having a default arrangement which has, relative to the corresponding tracks, a first amount of free space; and refining the shell into a cell, the refining including selectively shrinking, in the first direction, one or more of the wiring patterns resulting in a second amount of free space, the second amount being greater than the first amount, increasing, in the first direction, one or more chosen ones of the wiring patterns (chosen patterns), and backfilling the second amount of free space with one or more of at least one dummy pattern or at least one wiring pattern. In an embodiment, the method further includes adding one or more via patterns representing correspondingly one or more connections between the one or more chosen patterns of the first layer of metallization and the corresponding one or more wiring patterns included in the second layer of metallization. In an embodiment, at least one of the following is true: at least one of the chosen patterns is a pin pattern; or at least one of the chosen patterns is a trans-boundary intra-cell wiring pattern. In an embodiment, the cell includes first and second side boundaries which are substantially parallel and extend in a second direction, the second direction being substantially perpendicular to the first direction; and the increasing includes expanding, in the first direction, a given one of the chosen patterns so that a portion thereof has a first end which extends exterior to the first side boundary by a protrusion length which is substantially greater than the minimum boundary offset. In an embodiment, the cell includes first and second side boundaries which are substantially parallel and extend in a second direction, the second direction being substantially perpendicular to the first direction; and the refining further includes selectively removing an entirety of one of the wiring patterns so as to leave a corresponding track empty; and the backfilling the free space includes backfilling the empty track with a wiring pattern which is a feedthrough pattern that extends in the first direction across an entirety of the cell as well as exterior to the first and second side boundaries. In an embodiment, the method further includes fabricating, based on the layout diagram, at least one of (A) one or more semiconductor masks or (B) at least one component in a layer of a semiconductor device.

In an embodiment, a method (of generating a layout diagram, the layout diagram being stored on a non-transitory computer-readable medium) includes: generating a shell including wiring patterns in a first layer of metallization, the wiring patterns having long axes which are substantially aligned with corresponding tracks that extend in a first direction; the wiring patterns having a default arrangement which has, relative to the corresponding tracks, a first amount of free space; and refining the shell into a cell, the refining including: selectively shrinking, in the first direction, one or more of the wiring patterns resulting in one or more gaps along tracks corresponding to the one or more the wiring patterns being shrunk, the one or more gaps representing a second amount of free space, the second amount being greater than the first amount; increasing, in the first direction, one or more chosen ones of the wiring patterns (chosen patterns); and backfilling the one or more gaps with at least one dummy pattern. In some embodiments, the backfilling includes increasing a structural density of the layout diagram by the backfilling the one or more gaps with the one or more at least one dummy pattern. In some embodiments, the backfilling the one or more gaps includes substantially filling at least one of the one or more gaps with a corresponding one or more of the at least one dummy pattern. In some embodiments, the cell includes: first and second side boundaries which are substantially parallel and extend in a second direction, the second direction being substantially perpendicular to the first direction; and the increasing includes: expanding, in the first direction, a given one of the chosen patterns so that a portion thereof has a first end which extends exterior to the first side boundary by a protrusion length which is substantially greater than a minimum boundary offset. In some embodiments, the cell includes: first and second side boundaries which are substantially parallel and extend in a second direction, the second direction being substantially perpendicular to the first direction; and the refining further includes: selectively removing an entirety of one of the wiring patterns so as to leave a corresponding empty track; and the backfilling the one or more gaps includes: backfilling the empty track with a wiring pattern which is a feedthrough pattern that extends in the first direction across an entirety of the cell as well as exterior to the first and second side boundaries. In some embodiments, the method further includes fabricating, based on the layout diagram, at least one of (A) one or more semiconductor masks or (B) at least one component in a layer of a semiconductor device.

In an embodiment, a method (of generating a layout diagram, the layout diagram being stored on a non-transitory computer-readable medium) includes: generating a shell including wiring patterns in a first layer of metallization, the wiring patterns having long axes which are substantially aligned with corresponding tracks that extend in a first direction; the wiring patterns having a default arrangement which has, relative to the corresponding tracks, a first amount of free space; and refining the shell into a cell, the refining including: selectively shrinking, in the first direction, one or more of the wiring patterns resulting in one or more gaps along tracks corresponding to the one or more the wiring patterns being shrunk, the one or more gaps representing a second amount of free space, the second amount being greater than the first amount; increasing, in the first direction, one or more chosen ones of the wiring patterns (chosen patterns); and backfilling the one or more gaps with at least one wiring pattern. In some embodiments, the method further includes: adding one or more via patterns representing correspondingly one or more connections between the one or more chosen patterns of the first layer of metallization and the corresponding one or more wiring patterns included in the second layer of metallization. In some embodiments, at least one of the chosen patterns is a pin pattern. In some embodiments, at least one of the chosen patterns is a trans-boundary intra-cell wiring pattern. In some embodiments, the cell includes: first and second side boundaries which are substantially parallel and extend in a second direction, the second direction being substantially perpendicular to the first direction; and the increasing includes: expanding, in the first direction, a given one of the chosen patterns so that a portion thereof has a first end which extends exterior to the first side boundary by a protrusion length which is substantially greater than the minimum boundary offset. In some embodiments, the cell includes: first and second side boundaries which are substantially parallel and extend in a second direction, the second direction being substantially perpendicular to the first direction; and the refining further includes: selectively removing an entirety of one of the wiring patterns so as to leave a corresponding empty track; and the backfilling the one or more gaps includes: backfilling the empty track with a wiring pattern which is a feedthrough pattern that extends in the first direction across an entirety of the cell as well as exterior to the first and second side boundaries. In some embodiments, the method further includes: fabricating, based on the layout diagram, at least one of (A) one or more semiconductor masks or (B) at least one component in a layer of a semiconductor device.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of generating a layout diagram, the layout diagram being stored on a non-transitory computer-readable medium, the method comprising:
   generating a shell including wiring patterns which comprise a first layer of metallization, the wiring patterns having long axes which are substantially aligned with corresponding tracks that extend in a first direction;
   the wiring patterns having a default arrangement which has, relative to the corresponding tracks, a first amount of free space; and
   refining the shell into a cell, the refining including:
      selectively shrinking, in the first direction, one or more of the wiring patterns resulting in a second amount of free space, the second amount being greater than the first amount;
      increasing, in the first direction, one or more chosen ones of the wiring patterns (chosen patterns); and
      backfilling the second amount of free space with one or more of at least one dummy pattern or at least one wiring pattern.

2. The method of claim 1, further comprising:
   adding one or more via patterns representing correspondingly one or more connections between the one or more chosen patterns of the first layer of metallization and the corresponding one or more wiring patterns included in a second layer of metallization.

3. The method of claim 1, wherein at least one of the chosen patterns is a pin pattern.

4. The method of claim 1, wherein at least one of the chosen patterns is a trans-boundary intra-cell wiring pattern.

5. The method of claim 1, wherein:
   the cell includes:
      first and second side boundaries which are substantially parallel and extend in a second direction, the second direction being substantially perpendicular to the first direction; and
   the increasing includes:
      expanding, in the first direction, a given one of the chosen patterns so that a portion thereof has a first end which extends exterior to the first side boundary by a protrusion length which is substantially greater than the minimum boundary offset.

6. The method of claim 1, wherein:
   the cell includes:
      first and second side boundaries which are substantially parallel and extend in a second direction, the second direction being substantially perpendicular to the first direction; and
   the refining further includes:
      selectively removing an entirety of one of the wiring patterns so as to leave a corresponding empty track; and
   the backfilling the second amount of free space includes:
      backfilling the empty track with a wiring pattern which is a feedthrough pattern that extends in the first direction across an entirety of the cell as well as exterior to the first and second side boundaries.

7. The method of claim 1, further comprising:
   fabricating, based on the layout diagram, at least one of (A) one or more semiconductor masks or (B) at least one component in a layer of a semiconductor device.

8. A method of generating a layout diagram, the layout diagram being stored on a non-transitory computer-readable medium, the method comprising:
   generating a shell including wiring patterns which comprise a first layer of metallization, the wiring patterns having long axes which are substantially aligned with corresponding tracks that extend in a first direction;
   the wiring patterns having a default arrangement which has, relative to the corresponding tracks, a first amount of free space; and
   refining the shell into a cell, the refining including:
      selectively shrinking, in the first direction, one or more of the wiring patterns resulting in one or more gaps along tracks corresponding to the one or more wiring patterns being shrunk, the one or more gaps representing a second amount of free space, the second amount being greater than the first amount;
      increasing, in the first direction, one or more chosen ones of the wiring patterns (chosen patterns); and
      backfilling the one or more gaps with at least one dummy pattern.

9. The method of claim 8, wherein the backfilling includes:
   increasing a structural density of the layout diagram by the backfilling the one or more gaps with the at least one dummy pattern.

10. The method of claim 8, wherein:
the backfilling the one or more gaps includes:
  substantially filling at least one of the one or more gaps with a corresponding one or more of the at least one dummy pattern.

11. The method of claim 8, wherein
the cell includes:
  first and second side boundaries which are substantially parallel and extend in a second direction, the second direction being substantially perpendicular to the first direction; and
the increasing includes:
  expanding, in the first direction, a given one of the chosen patterns so that a portion thereof has a first end which extends exterior to the first side boundary by a protrusion length which is substantially greater than a minimum boundary offset.

12. The method of claim 8, wherein:
the cell includes:
  first and second side boundaries which are substantially parallel and extend in a second direction, the second direction being substantially perpendicular to the first direction; and
the refining further includes:
  selectively removing an entirety of one of the wiring patterns so as to leave a corresponding empty track; and
the backfilling the one or more gaps includes:
  backfilling the empty track with a wiring pattern which is a feedthrough pattern that extends in the first direction across an entirety of the cell as well as exterior to the first and second side boundaries.

13. The method of claim 1, further comprising:
fabricating, based on the layout diagram, at least one of (A) one or more semiconductor masks or (B) at least one component in a layer of a semiconductor device.

14. A method of generating a layout diagram, the layout diagram being stored on a non-transitory computer-readable medium, the method comprising:
  generating a shell including wiring patterns which comprise a first layer of metallization, the wiring patterns having long axes which are substantially aligned with corresponding tracks that extend in a first direction;
  the wiring patterns having a default arrangement which has, relative to the corresponding tracks, a first amount of free space; and
  refining the shell into a cell, the refining including:
    selectively shrinking, in the first direction, one or more of the wiring patterns resulting in one or more gaps along tracks corresponding to the one or more wiring patterns being shrunk, the one or more gaps representing a second amount of free space, the second amount being greater than the first amount;
    increasing, in the first direction, one or more chosen ones of the wiring patterns (chosen patterns); and
    backfilling the one or more gaps with at least one wiring pattern.

15. The method of claim 14, further comprising:
adding one or more via patterns representing correspondingly one or more connections between the one or more chosen patterns of the first layer of metallization and the corresponding one or more wiring patterns included in a second layer of metallization.

16. The method of claim 14, wherein at least one of the chosen patterns is a pin pattern.

17. The method of claim 14, wherein at least one of the chosen patterns is a trans-boundary intra-cell wiring pattern.

18. The method of claim 14, wherein
the cell includes:
  first and second side boundaries which are substantially parallel and extend in a second direction, the second direction being substantially perpendicular to the first direction; and
the increasing includes:
  expanding, in the first direction, a given one of the chosen patterns so that a portion thereof has a first end which extends exterior to the first side boundary by a protrusion length which is substantially greater than the minimum boundary offset.

19. The method of claim 14, wherein:
the cell includes:
  first and second side boundaries which are substantially parallel and extend in a second direction, the second direction being substantially perpendicular to the first direction; and
the refining further includes:
  selectively removing an entirety of one of the wiring patterns so as to leave a corresponding empty track; and
the backfilling the one or more gaps includes:
  backfilling the empty track with a wiring pattern which is a feedthrough pattern that extends in the first direction across an entirety of the cell as well as exterior to the first and second side boundaries.

20. The method of claim 14, further comprising:
fabricating, based on the layout diagram, at least one of (A) one or more semiconductor masks or (B) at least one component in a layer of a semiconductor device.

* * * * *